(12) United States Patent
Hoya et al.

(10) Patent No.: US 8,482,969 B2
(45) Date of Patent: Jul. 9, 2013

(54) SEMICONDUCTOR STORAGE DEVICE

(75) Inventors: Katsuhiko Hoya, Yokohama (JP); Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 13/228,255

(22) Filed: Sep. 8, 2011

(65) Prior Publication Data

US 2012/0069639 A1 Mar. 22, 2012

(30) Foreign Application Priority Data

Sep. 17, 2010 (JP) ................................. 2010-208930

(51) Int. Cl.
*G11C 11/00* (2006.01)

(52) U.S. Cl.
USPC .......................................... 365/158; 365/148

(58) Field of Classification Search
USPC ................. 365/48, 55, 62, 66, 74, 78, 80–93, 365/100, 130, 131, 148, 158, 171–173, 225.5, 365/243.5; 257/421, E21.665; 438/3; 977/933–935
See application file for complete search history.

(56) References Cited

U.S. PATENT DOCUMENTS 6,738,285 B2 5/2004 Tanizaki et al.
2009/0103354 A1* 4/2009 Yoon et al. ..................... 365/158

FOREIGN PATENT DOCUMENTS

JP 2003-228974 8/2003

* cited by examiner

*Primary Examiner* — Harry W Byrne
(74) *Attorney, Agent, or Firm* — Knobbe Martens Olson & Bear LLP

(57) ABSTRACT

A memory according to an embodiment includes bit lines, word lines, source lines, magnetic tunnel junction elements and transistors that are serially connected between the bit lines and the source lines, respectively, and a sense amplifier that detects data stored in the magnetic tunnel junction elements. The semiconductor storage device includes multiplexers between the bit lines and the sense amplifier in order to select one of the bit lines to be connected to the sense amplifier, and write amplifiers that are located corresponding to memory cell blocks each of which includes memory cells each including the magnetic tunnel junction element and the transistor and are connected to the bit lines or connected via the multiplexers to the bit lines. To write data, the sense amplifier applies a write voltage to the bit lines and then the write amplifiers hold the write voltage.

19 Claims, 15 Drawing Sheets

Write Operation

| | MTJi | | MTJj | |
|---|---|---|---|---|
| | 1-WRITE | 0-WRITE | 1-WRITE | 0-WRITE |
| bWDB0 | High | Low | Low | High |
| bWDB1 | Low | High | Low | High |
| bWDB2 | Low | High | High | Low |

FIG. 7A

Read Operation

| | MTJi | MTJj |
|---|---|---|
| BL0 | VBIAS | VSS |
| SL0 | VSS | VSS |
| BL1 | VSS | VBIAS |

FIG. 7B

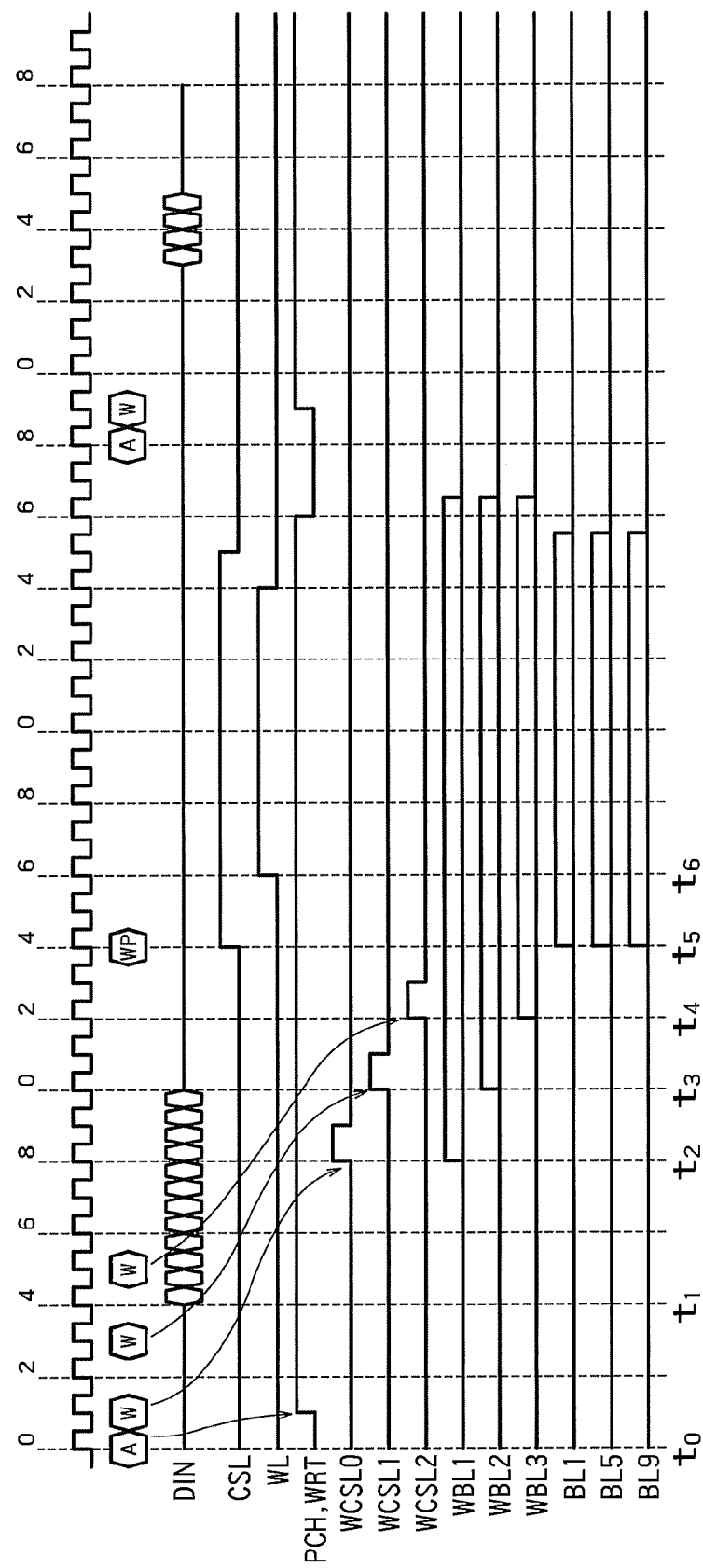

SEMICONDUCTOR STORAGE DEVICE

CROSS REFERENCE TO RELATED APPLICATIONS

This application is based upon and claims the benefit of priority from the prior Japanese Patent Application No. 2010-208930 filed on Sep. 17, 2010, the entire contents of which are incorporated herein by reference.

FIELD

The embodiment of the invention relates to a semiconductor storage device.

BACKGROUND

A magnetic random access memory (MRAM) is one of resistance random access memories. Writing methods of the MRAM include a magnetic-field writing method and a spin-injection writing method. Among these, the spin-injection writing method is advantageous in increasing the integration degree, reducing the power consumption, and enhancing the performance because it is characterized such that a spin injection current required for magnetization reversal becomes lower when a magnetic body has a smaller size. Furthermore, while erroneous writing to unselected memory cells may occur in the magnetic-field writing method due to spread of a magnetic field, such erroneous writing to unselected memory cells does not occur in the spin-injection writing method.

However, a read current in the spin-injection writing method is microscopic. To quickly sense a difference in these microscopic currents, sizes (current driving capabilities) of transistors included in sense amplifiers need to be increased to reduce performance fluctuations in differential amplification of the sense amplifiers. When the sizes of the transistors are increased, this results in increase in the sizes of the sense amplifiers themselves. Consequently, when the MRAM is further downscaled, it becomes difficult to arrange the sense amplifier with respect to each bit line pair. Therefore, when the MRAM is further downscaled, the sense amplifier is shared by plural bit line pairs. That is, the number of data (page size) that can be written or read in one access is reduced. Accordingly, the conventional MRAM using the spin-injection writing method adversely has a lower write or read speed than a DRAM, for example. Furthermore, the write time is longer than the read time in the MRAM. Because of this, a low data write speed has been a problem in the MRAM.

BRIEF DESCRIPTION OF THE DRAWINGS

FIG. 7A is a table showing a relation between the signals bWDB0 to bWDB2 shown in FIG. 6B and the write data;

FIG. 7B is a table showing voltages to be applied to the bit lines BL0 and BL1 and the source line SL0 at the time of reading;

FIG. 16 is a timing chart showing a data write operation of the MRAM according to the fifth embodiment.

DETAILED DESCRIPTION

A semiconductor storage device according to an embodiment of the present invention includes a plurality of bit lines, a plurality of word lines, source lines, magnetic tunnel junction elements and transistors that are serially connected between the bit line and the source line, respectively, and a sense amplifier that detects data stored in the magnetic tunnel junction elements. The semiconductor storage device includes multiplexers between the bit lines and the sense amplifier in order to select one of the bit lines to be connected to the sense amplifier, and a plurality of write amplifiers that are located corresponding to a plurality of memory cell blocks each of which includes a plurality of memory cells each including the magnetic tunnel junction element and the transistor and are connected to the bit lines or connected via the multiplexers to the bit lines. To write data, the sense amplifier applies a write voltage to the bit lines and then the write amplifiers hold the write voltage.

Embodiments will now be explained with reference to the accompanying drawings. The present invention is not limited to the embodiments.
(First Embodiment)

Figure 1:
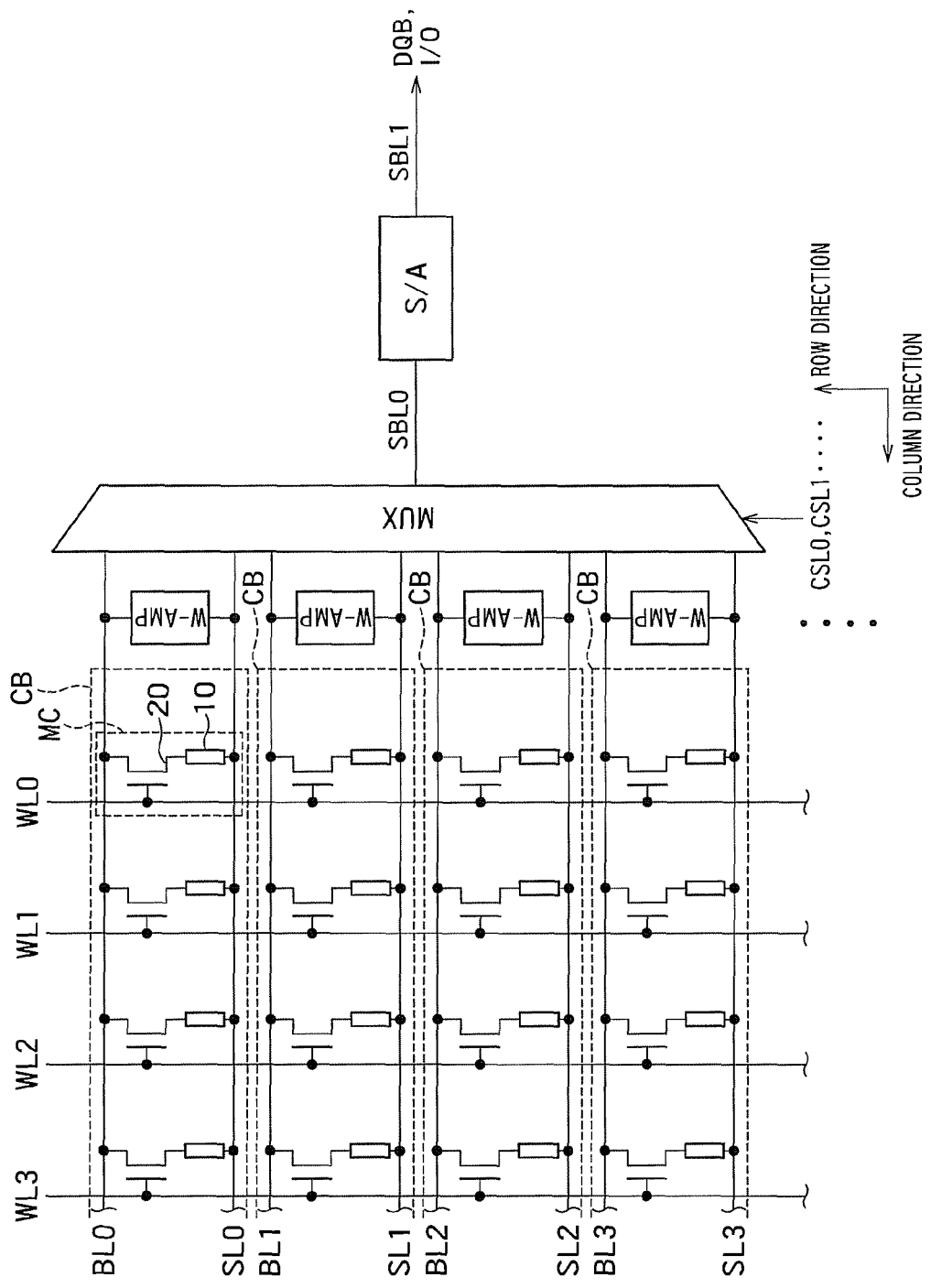
FIG. 1 is a block diagram of a memory cell array and peripheral circuits of a MRAM according to a first embodiment.

FIG. 1 is a block diagram of a memory cell array and peripheral circuits of a magnetic random access memory (hereinafter, MRAM) according to a first embodiment of the present invention. The MRAM according to the first embodiment includes bit lines BLi (i is an integer), word lines WLi, source lines SLi, memory cells MC, write amplifiers W-AMP, multiplexers MUX, and a sense amplifier S/A. Here, the number of constituent elements shown in FIG. 1 is not restrictive but many configurations as shown in FIG. 1 can be provided.

The bit lines BLi extend in a column direction. The word lines WLi extend in a row direction perpendicular to the column direction. The source lines SLi extend in the column direction like the bit lines BLi. The bit lines BLi and the source lines SLi are paired, respectively.

The memory cells MC are two-dimensionally arranged in a matrix to form a memory cell array. Each of the memory cells MC is placed corresponding to an intersection between the bit line BLi (the source line SLi) and the word line WLi. The bit lines, the word lines, and the source lines are hereinafter denoted by BL, WL, and SL, respectively, for the sake of simplicity.

Each of the memory cells MC includes a magnetic tunnel junction (MTJ) element 10 and a cell transistor 20. The MTJ elements 10 and the cell transistors 20 are serially connected between the bit line BL and the source line SL, respectively. In each of the memory cells MC, the cell transistor 20 is located on the side of the bit line BL and the MTJ element 10 is located on the side of the source line SL. The cell transistors 20 have gates connected to the word lines WL. Plural memory cells MC connected to the same bit lines BL and connected to the corresponding word lines WL configure one memory cell block CB. The memory cell blocks CB correspond to the bit lines BL, respectively.

The bit lines BL are connected to the multiplexers MUX. The multiplexers MUX are connected to the sense amplifier S/A via one sense bit line SBL0. That is, each of the multiplexers MUX is connected between plural bit lines BL and one sense amplifier S/A. The sense amplifier S/A is further connected to a DQ buffer DQB and an input/output circuit I/O via a sense bit line SBL1. In the first embodiment, the sense amplifier S/A is shared by four bit lines BL0 to BL3. The multiplexer MUX connects one of the four bit lines BL to the sense bit line SBL0 according to a signal from a column selection line CSLi (hereinafter, also simply as CSL). The sense amplifier S/A detects data stored in the memory cells MC via the bit line BL connected to the sense bit line SBL0 by the multiplexer MUX. The sense amplifier S/A temporarily holds write data received from outside via the input/output circuit I/O and writes the write data to the write amplifier W-AMP via the sense bit line SBL0 and the bit line BL. At that time, the multiplexer MUX selectively connects one of the bit lines BL to the sense bit line SLB0 according to a signal from the column select line CSL.

The write amplifiers W-AMP are each connected between the bit line BL and the source line SL and provided corresponding to each of the memory cell blocks CB. That is, the write amplifiers W-AMP are each provided corresponding to each column and configured to temporarily store therein data to be written to the corresponding column. In the first embodiment, the write amplifiers W-AMP are located between the memory cell blocks CB and the multiplexers MUX. Detailed configurations of the write amplifier W-AMP are explained later.

In a read operation, the sense amplifier S/A reads data in a selected memory cell MC connected a selected word line WL and a selected bit line BL. The sense amplifier S/A is shared by the four bit lines BL0 to BL3. Accordingly, the sense amplifier S/A reads data of the memory cells MC in the respective columns one by one.

In a write operation, the multiplexer MUX selects a bit line BL according to the column select line CSL and connects the selected bit line BL to the sense bit line SBL0. In this way, the sense amplifier S/A successively transmits the write data to the write amplifiers W-AMP in the respective columns via the multiplexer MUX. Of course, the data to be written to the respective columns can be different digital data. The write amplifier W-AMP in each column temporarily holds the data to be written to the selected memory cell MC in the corresponding column (a first writing step). At that time, selection of the word line WL is not performed yet and the data is not written to the memory cells MC in each column. After the write amplifiers W-AMP in all columns as write targets hold the write data (after the first writing step ends), the write amplifiers W-AMP simultaneously write the data to the selected memory cells MC as the write targets by driving of a selected word line WL (a second writing step). That is, in the write operation, the write data is temporarily written from the sense amplifier S/A to the write amplifiers W-AMP and then the data are concurrently written from the write amplifiers W-AMP to the memory cells MC by driving of the selected word line WL. Because the write amplifiers W-AMP are provided corresponding to the columns, respectively, the data can be simultaneously written to the memory cells MC in all the columns.

Figure 2:
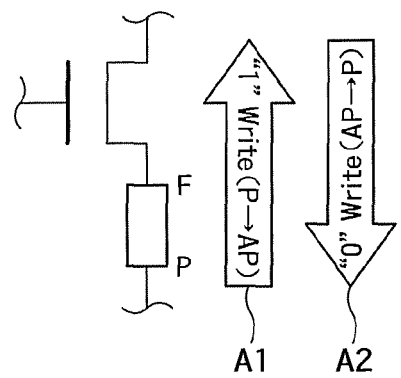
FIG. 2 is an explanatory diagram showing a write operation for one memory cell.

FIG. 2 is an explanatory diagram showing a write operation for one memory cell. An MTJ element using TMR (tunneling magnetoresistive) effect has a stacked structure including two ferromagnetic layers and a nonmagnetic layer (an insulating fin film) placed therebetween and stores therein digital data according to changes in magnetic resistance caused by spin polarization tunnel effect. The MTJ element can have a low resistance state and a high resistance state depending on magnetic orderings of the two ferromagnetic layers. For example, when the low resistance state is defined as data "0" and the high resistance state as data "1", 1-bit data can be recorded in the MTJ element. Of course, it is also possible to define the lower resistance state as data "1" and the high resistance state as data "0". The MTJ element is formed by sequentially stacking a fixed layer, a tunnel barrier layer, and a recording layer, for example. The pin (fixed) layer P and the free (recording) layer F are composed of a ferromagnetic material and the tunnel barrier layer is composed of an insulating film. The pin layer P has a fixed magnetization direction. The free layer F has variable magnetization directions and stores therein data according to the magnetization directions.

When a current is flowed in a direction shown by an arrow A1 at the time of writing, the magnetization direction of the free layer F becomes antiparallel to that of the pin layer P and the MTJ element comes to the high resistance state (data "1"). When a current is flowed in a direction shown by an arrow A2 at the time of writing, the magnetization directions of the pin layer P and the free layer F become parallel and the MTJ element comes to the low resistance state (data "0"). In this way, different data can be written to the MTJ element according to the flowing directions of the current.

Figure 3A:
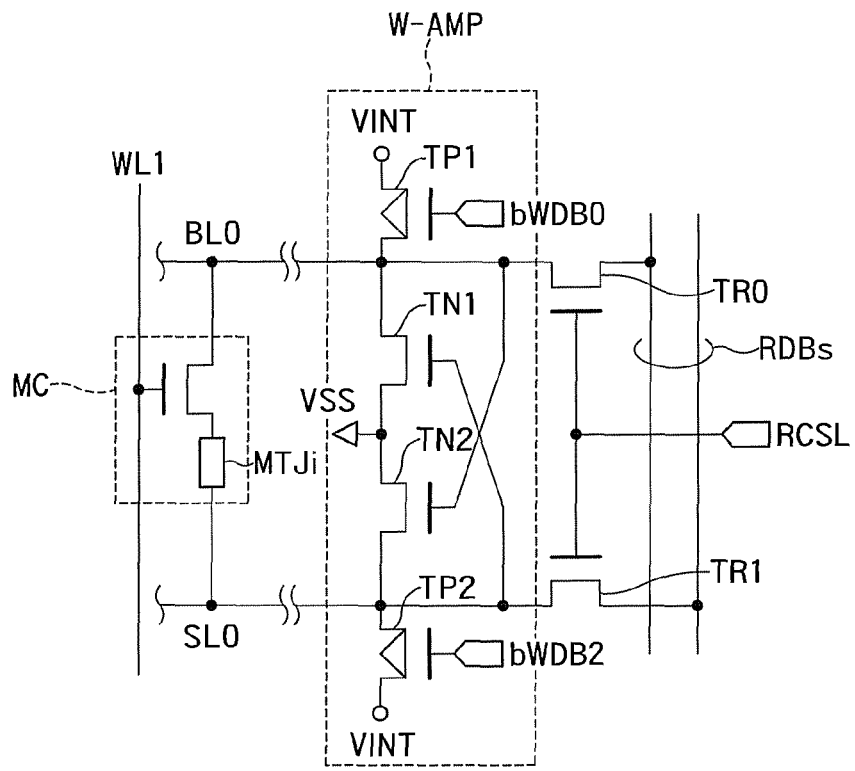
FIGS. 3A and 3B are circuit diagrams showing a configuration of the write amplifier W-AMP according to the first embodiment.
Figure 3B:
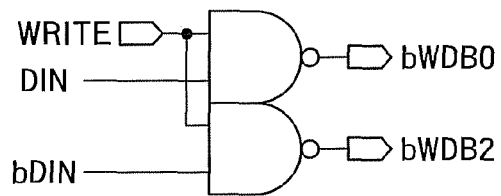

FIGS. 3A and 3B are circuit diagrams showing a configuration of the write amplifier W-AMP according to the first embodiment. FIG. 3B shows a logic circuit generating signals to be applied to the write amplifier W-AMP.

The write amplifier W-AMP includes N-type transistors TN1 and TN2 and P-type transistors TP1 and TP2. The transistors TN1 and TN2 are serially connected between adjacent bit lines BL0 and BL1. Gates of the transistors TN1 and TN2 are cross-connected to the bit lines BL0 and BL1. That is, the gate of the transistor TN1 located on the side of the bit line BL0 is connected to the bit line BL1 and the gate of the transistor TN2 located on the side of the bit line BL1 is connected to the bit line BL0. A node between the transistors TN1 and TN2 is connected to a low-level voltage supply VSS. The transistor TP1 is connected between the bit line BL0 and a high-level voltage supply VINT and the transistor TP2 is connected between the bit line BL1 and the high-level voltage supply VINT. Write signals bWDB0 and bWDB2 obtained by the logic circuit shown in FIG. 3B are applied to gates of the transistors TP1 and TP2, respectively. The write signals bWDB0 and bWDB2 are complementary signals. This enables to set one of the bit lines BL0 and BL1 at a high level voltage and the other at a low level voltage. The transistors TN1 and TN2 operate to latch voltage states of the bit lines BL0 and BL1. Consequently, the write amplifier W-AMP can hold the write data.

TR0 and TR1 denote transfer gates transferring data from the sense amplifier S/A to the bit lines via a signal line RDBs.

The logic circuit shown in FIG. 3B is explained. This logic circuit is provided corresponding to each of the write amplifiers W-AMP (each of the memory cell blocks CB) to control the write amplifier W-AMP. The logic circuit is not limited to the configuration shown in FIG. 3B but can have any configuration so long as the same result (output signal) can be obtained from the same input signal.

In the first embodiment, the logic circuit includes two NAND gates. Data signals DIN and bDIN are write data and complementary to each other. The data signal DIN is logic high when the write data is "1". The data signal DIN is logic low when the write data is "0". A write enable signal WRITE enables writing to the memory cells MC. When writing to the memory cells MC is possible, the write enable signal WRITE is logic high.

The logic circuit shown in FIG. 3B receives the signals DIN, bDIN, and WRITE and outputs control signals bWDB0 and bWDB2. For example, the write enable signal WRITE is logic high in the write operation. Therefore, the control signals bWDB0 and bWDB2 become an inversion signal of the signal DIN and an inversion signal of the signal bDIN, respectively.

For example, the control signals bWDB0 and bWDB2 become logic low and logic high, respectively, when the data signal DIN is logic high (data "1"). In this way, the bit line BL0 is set at the high level voltage (VINT) and the source line SL0 is set at the low level voltage (VSS). The control signals bWDB0 and bWDB2 become logic high and logic low, respectively, when the data signal DIN is logic low (data "0"). In this way, the bit line BL0 is set at the low level voltage (VSS) and the source line SL0 is set at the high level voltage (VINT).

Figure 4:
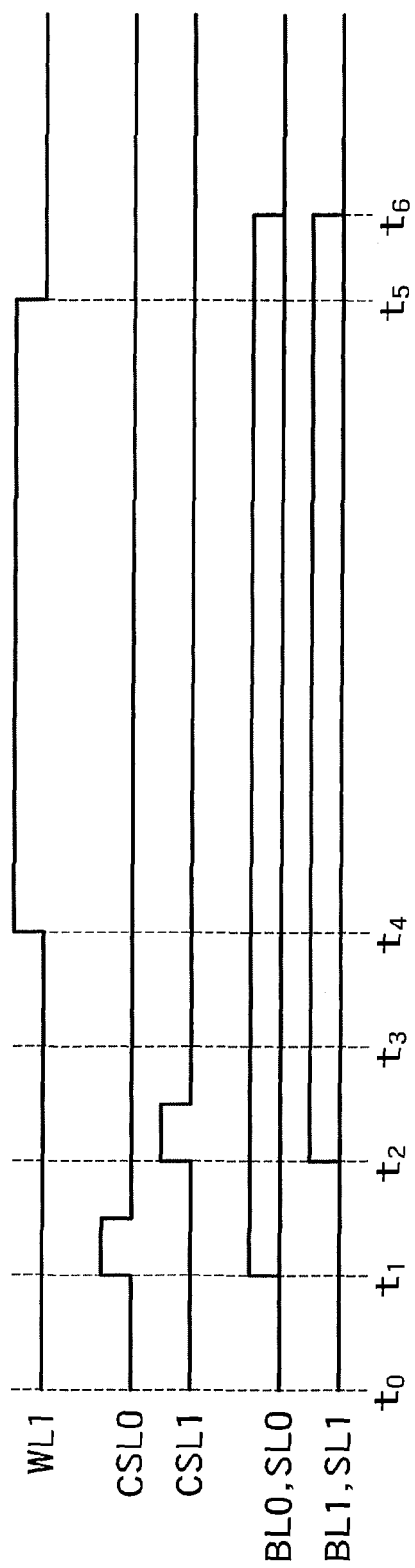
FIG. 4 is a timing chart showing a data write operation of the MRAM according to the first embodiment.

FIG. 4 is a timing chart showing a data write operation of the MRAM according to the first embodiment. Here, the word line WL1 is selected and data are written to the memory cells MC in the respective columns connected to the word line WL1, for example. In an example shown in FIG. 4, data are written to the memory cells MC in two columns of the bit lines BL0 and BL1. However, data can be written to the memory cells MC in three or more columns, or in all the columns.

When a write operation is started, the write enable signal WRITE shown in FIG. 3B is raised and the logic circuit shown in FIG. 3B becomes an active state. This causes the logic circuit to drive the write amplifier W-AMP according to the write data DIN.

At a time t1, the voltage of the column select line CSL0 is raised. This causes the multiplexer MUX to select the bit line BL0 and connect the bit line BL0 to the sense bit line SBL0. The sense amplifier S/A transmits data, which is to be written to the memory cell MC connected to the bit line BL0 and the word line WL1, to the bit line BL0. At that time, the bit line BL0 has a higher-level voltage or a lower-level voltage than that of the source line SL0 according to the write data. The write amplifier W-AMP corresponding to the bit line BL0 latches the voltage of the bit line BL0. In this way, the write data is stored in the write amplifier W-AMP.

At a time t2, the voltage of the column select line CSL1 rises. This causes the multiplexer MUX to select the bit line BL1 and connect the bit line BL1 to the sense bit line SBL0. The sense amplifier S/A transmits data, which is to be written to the memory cell MC connected to the bit line BL1 and the word line WL1, to the bit line BL1. At that time, the bit line BL1 has a higher-level voltage or a lower-level voltage than that of the source line SL0 according to the write data. The write amplifier W-AMP corresponding to the bit line BL1 latches the voltage of the bit line BL1. In this way, the write data is stored in the write amplifier W-AMP.

At a time t4, the word line WL1 is selected and the voltage of the word line WL1 is raised. At that time, the column select lines CSLi are all in inactive states and all the bit lines BL are disconnected from the sense amplifier S/A. However, the write amplifiers W-AMP in the respective columns hold the write data and apply a write voltage to the bit lines BL0 and BL1. Accordingly, by driving the word line WL1, the write amplifiers W-AMP in the respective columns write the write data to plural memory cells MC connected to the word line WL1 and the bit lines BL0 and BL1. At that time, the write amplifiers W-AMP in the respective columns simultaneously (concurrently) write the data to the plural memory cells MC.

Subsequently, at a time t5, the selected word line WL1 falls to an inactive state. At a time t6, the write amplifiers W-AMP are reset and the bit lines BL0 and BL1 return to a source line voltage.

In this way, in the write operation, the sense amplifier S/A temporarily writes the write data for the respective columns to the write amplifiers W-AMP and then the write amplifiers W-AMP concurrently write the write data to the memory cells MC in the respective columns.

In the write operation, the write voltage needs to be applied to the memory cells MC for a relatively long period in order to change the magnetization direction of the MTJ element. Therefore, when the sense amplifier S/A directly writes data to the memory cells MC in the respective columns like in the conventional technique, the write time becomes quite long as described above.

In contrast, in the first embodiment, the sense amplifier S/A writes data to the write amplifiers W-AMP in the respective columns. Because the write amplifiers W-AMP are latch circuits including MOSFETs, the data can be stored therein in a quite shorter period of time than the MTJ element. After the data are written to the write amplifiers W-AMP in write target columns, the write amplifiers W-AMP in the write target columns concurrently write the data to the memory cells MC at the same time as driving of the selected word line WL. The write amplifiers W-AMP can write the data to the memory cells MC during a precharge period, for example. Therefore, the substantial data write time can be only a time required to write the data from the sense amplifier S/A to the write amplifiers W-AMP. As a result, the MRAM according to the first embodiment can greatly reduce the data write time.

The effect of the first embodiment can be rephrased as follows. Assuming that the sense amplifier S/A is provided for every four bit lines BL, a page size PS in one write is a quarter of a page size of all the columns in a conventional MRAM having no write amplifiers W-AMP. In contrast, the write amplifiers W-AMP are provided corresponding to the bit lines BL in the respective columns in the first embodiment and therefore data of a page size of 4×PS can be written in one write operation. As a result, the MRAM according to the first embodiment can increase an effective writing transfer rate and speed-up a data write operation.

Furthermore, it can be said that the data write is realized by two writing steps in the first embodiment. That is, the sense amplifier S/A writes data to the write amplifiers W-AMP in the respective columns (the first writing step) and then the write amplifiers W-AMP concurrently perform writing of the data to the memory cells MC at the same time as driving of the selected word line WL (the second writing step). The second writing step as a writing step for the MTJ elements requires a longer period of time than the first writing step. However, because the second writing step can be practically executed during a precharge period, the substantial write time can be only the first writing step. Therefore, the MRAM according to the first embodiment can increase the effective writing transfer rate and speed-up the data write operation.

(Second Embodiment)

Figure 5:
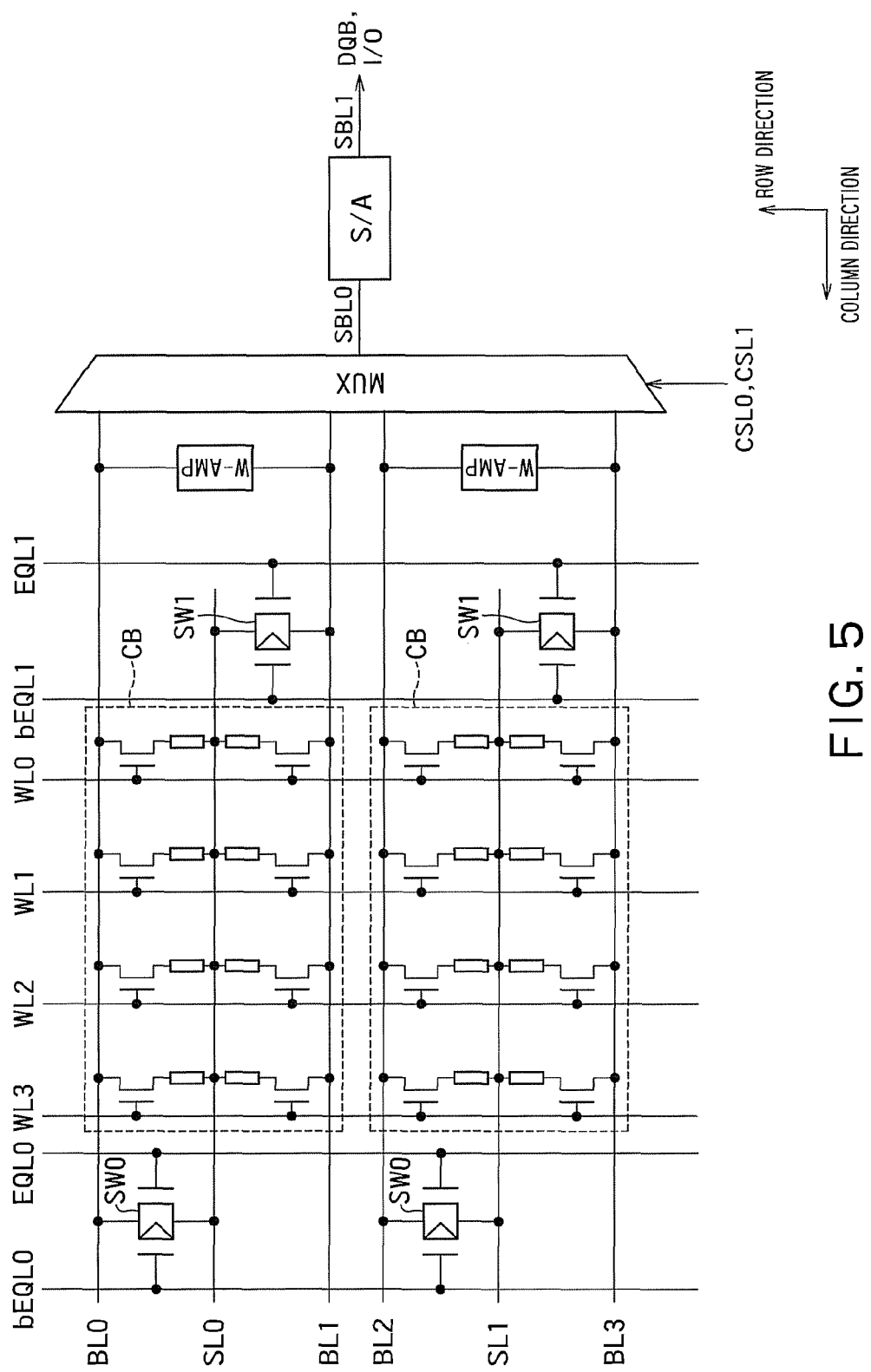
FIG. 5 is a block diagram of a memory cell array and peripheral circuits of an MRAM according to a second embodiment.

FIG. 5 is a block diagram of a memory cell array and peripheral circuits of an MRAM according to a second embodiment of the present invention. In the MRAM according to the second embodiment, memory cells MC in adjacent two columns share a source line SL. Accordingly, one source line SL is provided for two bit lines BL. For example, the source line SL0 is provided for a pair of bit lines BL0 and BL1 and the source line SL1 is provided for a pair of bit lines BL2 and BL3.

The write amplifiers W-AMP are connected between adjacent bit lines BL. That is, the write amplifier W-AMP is connected between the bit line pair BL0 and BL1. For example, the write amplifiers W-AMP are connected between the bit lines BL0 and BL1 and between the bit lines BL2 and BL3, respectively.

Short-circuit switches SW0 and SW1 are connected between the bit line BL and the source line SL, respectively. For example, the short-circuit switches SW0 are connected between the bit line BL0 and the source line SL0 and between the bit line BL2 and the source line SL1, respectively. The short-circuit switches SW1 are connected between the bit line BL1 and the source line SL0 and between the bit line BL3 and the source line SL1, respectively. The short-circuit switches SW0 and SW1 are controlled by equalizing lines EQL0, bEQL0, EQL1, and bEQL1. The equalizing lines EQL0 and bEQL0 transmit complementary signals and the equalizing lines EQL0 and EQL1 transmit complementary signals. Therefore, when ones of the short-circuit switches SW0 and SW1 are in a conduction state, the others are in a non-conduction state.

When the shirt-circuit switches SW0 are in the conduction state, the bit line BL0 has a voltage equal to that of the source line SL0 and the bit line BL2 has a voltage equal to that of the source line SL1. Accordingly, no electric field is applied to the memory cells MC connected to the bit lines BL0 and BL2 during writing or reading. Because the short-circuit switches SW1 are in the non-conduction state at that time, a voltage can be applied only to the memory cells MC connected to the bit lines BL1 and BL3.

On the other hand, when the short-circuit switches SW1 are in the conduction state, the bit line BL1 has a voltage equal to that of the source line SL0 and the bit line BL3 has a voltage equal to that of the source line SL1. Accordingly, no electric field is applied to the memory cells MC connected to the bit lines BL1 and BL3 during writing or reading. Because the short-circuit switches SW0 are in the non-conduction state at that time, a voltage can be applied only to the memory cells MC connected to the bit lines BL0 and BL2.

In the second embodiment, one write amplifier W-AMP is provided for a bit line pair BLi and BLi+1. Therefore, to write data to the memory cells MC in all the columns, the memory needs to perform writing operation from the sense amplifier S/A to the write amplifiers W-AMP (the first writing step) and writing operation from the write amplifiers W-AMP to the memory cells MC (the second writing step) twice, respectively. For example, the memory performs the first and second writing steps to write data to the memory cells MC connected to the bit lines BL0 and BL2 in a state where the short-circuit switches SW1 are brought into conduction and the short-circuit switches SW0 are brought into non-conduction. The memory, then, performs the first and second writing steps to write data to the memory cells MC connected to the bit lines BL1 and BL3 in a state where the short-circuit switches SW0 are brought into conduction and the short-circuit switches SW1 are brought into non-conduction.

Other configurations and operations of the MRAM according to the second embodiment can be identical to those of the MRAM according to the first embodiment.

Figure 6A:
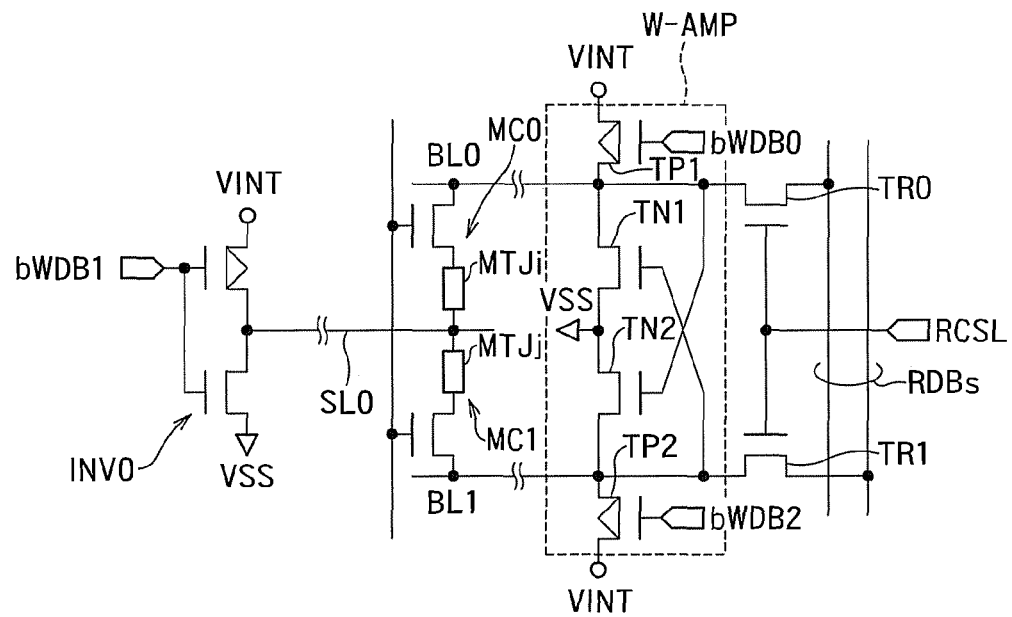
FIGS. 6A and 6B are explanatory diagrams showing a configuration of the write amplifier W-AMP according to the second embodiment.
Figure 6B:
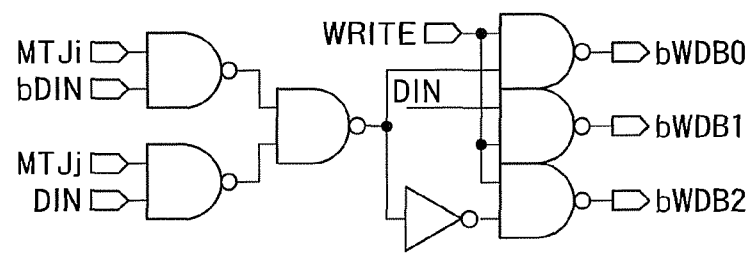

FIGS. 6A and 6B are explanatory diagrams showing a configuration of the write amplifier W-AMP according to the second embodiment. FIG. 6B shows a logic circuit generating signals to be applied to the write amplifier W-AMP.

The write amplifier W-AMP shown in FIG. 6A has the same configuration as that of the write amplifier W-AMP shown in FIG. 3A, and therefore explanations thereof will be omitted.

An inverter INV0 receives a control signal bWDB1 generated by the logic circuit shown in FIG. 6B and connects the source line SL0 to either the high-level voltage supply VINT or the low-level voltage supply VSS. The inverter INV0 connects a voltage of the source line SL0 to the power supply VINT or VSS according to whether the write data is the data "0" or "1". For example, the inverter INV0 connects the source line SL0 to the power supply VINT when the data "1" is to be written to the memory cells MC, and the inverter INV0 connects the source line SL0 to the power supply VSS when the data "0" is to be written to the memory cells MC.

The logic circuit shown in FIG. 6B is explained. The logic circuit is provided for each of the write amplifiers W-AMP (each of the memory cell blocks CB) to control the write amplifier W-AMP and the inverter INV0. Here, the logic circuit is not limited to the configuration shown in FIG. 6B but can have any configuration so long as it can obtain the same result (output signal) from the same input signal.

In the second embodiment, the logic circuit includes six NAND gates and an inverter. Select signals MTJi and MTJj indicate which of two columns sharing the source line SL is to be selected. Therefore, the signals MTJi and MTJj are complementary signals. When the signal MTJi is logic high, a column including a memory cell MC0 shown in FIG. 6A is selected. When the signal MTJj is logic high, a column including a memory cell MC1 shown in FIG. 6A is selected. The data signals DIN and bDIN are the write data and complementary to each other. The data signal DIN is logic high when the write data is "1" and the data signal DIN is logic low when the write data is "0". The write enable signal WRITE enables writing to the memory cells MC. When writing to the memory cells MC is possible, the write enable signal WRITE is logic high.

The logic circuit shown in FIG. 6B receives the signals MTJi, MTJj, DIN, bDIN, and WRITE and outputs control signals bWDB0 to bWDB2. For example, in a write operation, the write enable signal WRITE is logic high. Therefore, the control signal bWDB1 becomes an inversion signal of the data signal DIN. Accordingly, when the data signal DIN is logic high (data "1"), the inverter INV0 shown in FIG. 6A connects the high-level voltage supply VINT to the source line SL0. On the other hand, when the data signal DIN is logic low (data "0"), the inverter INV0 connects the low-level voltage supply VSS to the source line SL0.

For example, when a column including the memory cell MC0 is selected, the select signal MTJi becomes logic high and the select signal MTJj becomes logic low. When the data signal DIN is logic high (data "1"), the control signals bWDB0 and bWDB2 become logic high and logic low, respectively. When the data signal DIN is logic low (data "0"), the control signals bWDB0 and bWDB2 become logic low and logic high, respectively.

For example, when a column including the memory cell MC1 is selected, the select signal MTJj becomes logic high and the select signal MTJi becomes logic low. When the data signal DIN is logic high (data "1"), the control signals bWDB0 and bWDB2 become logic low and logic high, respectively. When the data signal DIN is logic low (data "0"), the control signals bWDB0 and bWDB2 become logic high and logic low, respectively. Tables summarizing these logical operations are shown in FIG. 7.

FIG. 7A is a table showing a relation between the signals bWDB0 to bWDB2 shown in FIG. 6B and the write data. When the column including the memory cell MC0 (MTJi) is selected and the write data to the memory cell MC0 is "1", the control signals bWDB0 to bWDB2 become logic high, logic low, and logic low, respectively. Therefore, the write amplifier W-AMP shown in FIG. 6A holds the bit lines BL0 and BL1 at the low-level voltage (VSS) and the high-level voltage (VINT), respectively. The inverter INV0 sets the source line SL0 at the high-level voltage (VINT).

When the column including the memory cell MC0 is selected, the short-circuit switch SW1 shown in FIG. 5 comes into conductive. Accordingly, the bit line BL1 and the source line SL0 set at the high-level voltage are short-circuited, which prevents writing of data to memory cells in the non-selected column including the memory cell MC1.

On the other hand, the bit line BL0 is latched at the low-level voltage and the source line SL0 is set at the high-level voltage. Therefore, an electric field from the source line SL0 to the bit line BL0 is applied to the memory cells in the selected column including the memory cell MC0 and the data "1" is written thereto.

When the write data to the memory cell MC0 is "0", the control signals bWDB0 to bWDB2 become logic low, logic high, and logic high, respectively. Therefore, the write amplifier W-AMP shown in FIG. 6A holds the bit lines BL0 and BL1 at the high-level voltage (VINT) and the low-level voltage (VSS), respectively. The inverter INV0 sets the source line SL0 at the low-level voltage (VSS).

When the column including the memory cell MC0 is selected, the short-circuit switch SW1 shown in FIG. 5 comes into conductive. Accordingly, the bit line BL1 and the source line SL0 set at the low-level voltage are short-circuited and no data is written to the memory cells in the non-selected column including the memory cell MC1.

On the other hand, the bit line BL0 is latched at the high-level voltage and the source line SL0 is set at the low-level voltage. Therefore, an electric field from the bit line BL0 to the source line SL0 is applied to the memory cells in the selected column including the memory cell MC0 and the data "0" is written thereto.

Because a case where the memory cell MC1 is selected can be easily understood while referring to the above descriptions and FIGS. 5 to 7A, explanations thereof will be omitted.

When the bit line BL0 (or the bit line BL1) shown in FIG. 5 is selected, the bit line BL1 (or the bit line BL0) and the source line SL0 are short-circuited. Accordingly, an equivalent circuit thereof has the same configuration as that shown in FIG. 1. Therefore, operations after selection of a bit line in the second embodiment can be basically identical to corresponding operations in the first embodiment.

FIG. 7B is a table showing voltages to be applied to the bit lines BL0 and BL1 and the source line SL0 at the time of reading. At the time of data reading, the write enable signal WRITE is inactivated to be logic low and therefore the control signals bWDB0 to bWDB2 shown in FIG. 6B are all set at logic high. Accordingly, the write amplifier W-AMP shown in FIG. 6A is not driven and the inverter INV0 keeps connecting the low-level voltage VSS to the source line SL0.

When the memory cell MC0 (MTJi) is selected at the time of reading, the short-circuit switch SW1 shown in FIG. 5 comes into conductive. This causes the bit line BL1 to be short-circuited to the source line SL0 set at the low-level voltage (VSS) and to have the same voltage as the source line SL0. Accordingly, data in the memory cell MC1 is not detected. On the other hand, a voltage VBIAS is applied to the bit line BL0 and the sense amplifier S/A detects data in the memory cell MC0.

When the memory cell MC1 (MTJj) is selected at the time of reading, the short-circuit switch SW0 shown in FIG. 5 comes into conductive. This causes the bit line BL0 to be short-circuited to the source line SL0 set at the low-level voltage (VSS) and to have the same voltage as the source line SL0. Accordingly, the data in the memory cell MC1 is not detected. On the other hand, the voltage VBIAS is applied to the bit line BL1, and the sense amplifier S/A detects the data in the memory cell MC0.

In the second embodiment, each write amplifier W-AMP is provided for plural bit lines BL (plural columns). At the time of data writing, each write amplifier W-AMP performs writing only to the memory cells MC connected to one of the bit lines BL.

Therefore, a page size writable at one time in the second embodiment is smaller than that in the first embodiment. However, as compared to a page size PS in the conventional method in which writing is performed directly to the memory cells from the sense amplifier S/A, the page size writable at one time in the second embodiment is 2×PS. Therefore, also the MRAM according to the second embodiment can increase the effective writing transfer rate and speed-up the data writing operation.

On the other hand, a circuit scale can be made relatively smaller in the second embodiment because each of the write amplifiers W-AMP is provided for plural bit lines (plural columns).

(Third Embodiment)

Figure 8:
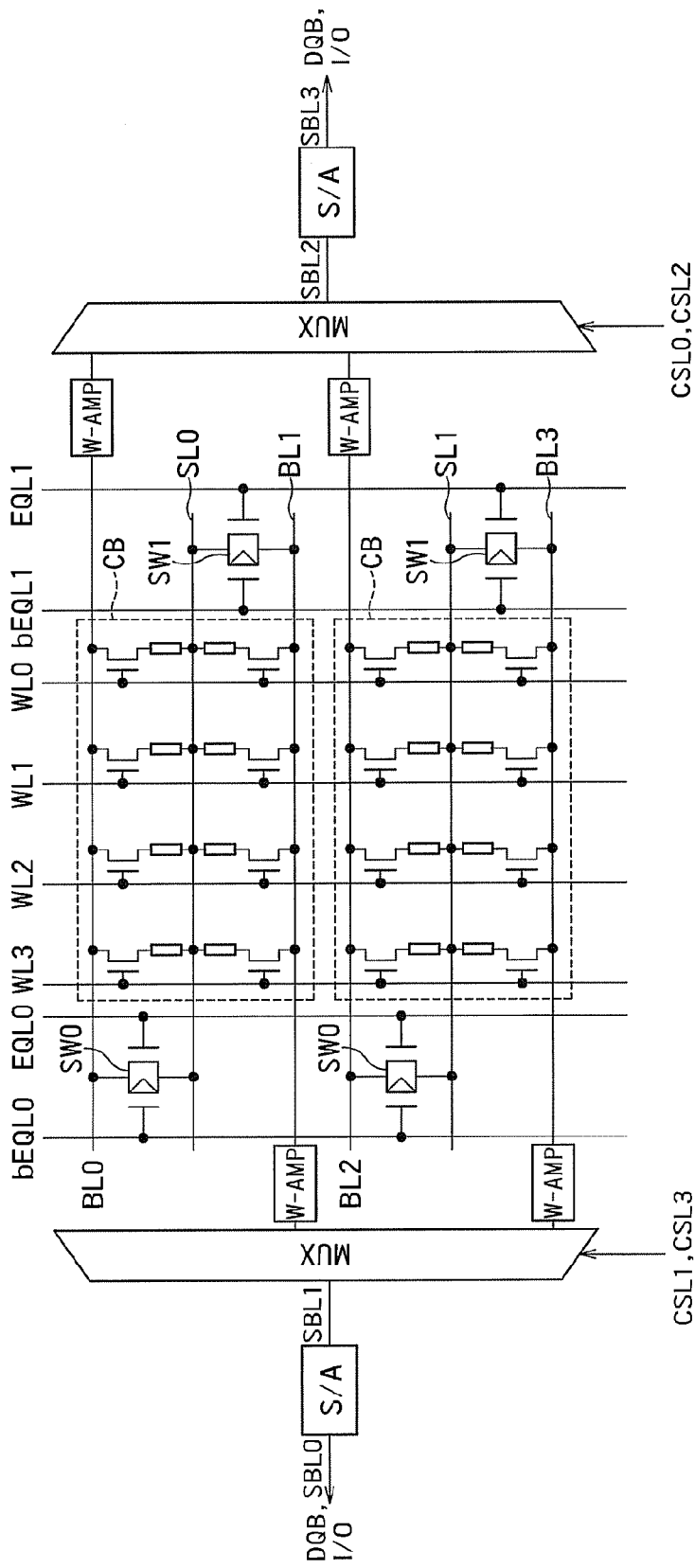
FIG. 8 is a block diagram of a memory cell array and peripheral circuits of an MRAM according to a third embodiment.

FIG. 8 is a block diagram of a memory cell array and peripheral circuits of an MRAM according to a third embodiment of the present invention. Memory cell blocks CB and short-circuit switches SW0 and SW1 of the third embodiment can have identical configurations as those in the second embodiment.

In the third embodiment, the write amplifiers W-AMP are provided corresponding to the bit lines BL and are connected between the corresponding bit line BL and the multiplexer MUX, respectively. The write amplifiers W-AMP, the multiplexers MUX, and the sense amplifiers S/A are provided on both sides of the memory cell array.

Two write amplifiers W-AMP connected to a bit line pair BLi and BLi+1 are located on opposite sides of the memory cell array to each other. For example, the write amplifier W-AMP connected to the bit line BL0 is located on an opposite side of the memory cell array to the write amplifier W-AMP connected to the bit line BL1.

In the second embodiment, the adjacent bit line pair BLi and BLi+1 needs to transmit complementary data at the time of writing. However, in the third embodiment, because the write amplifier W-AMP corresponds to the respective bit line BL, the bit line pair BLi and BLi+1 does not need to transmit complementary data but can transmit respective write data.

Figure 9:
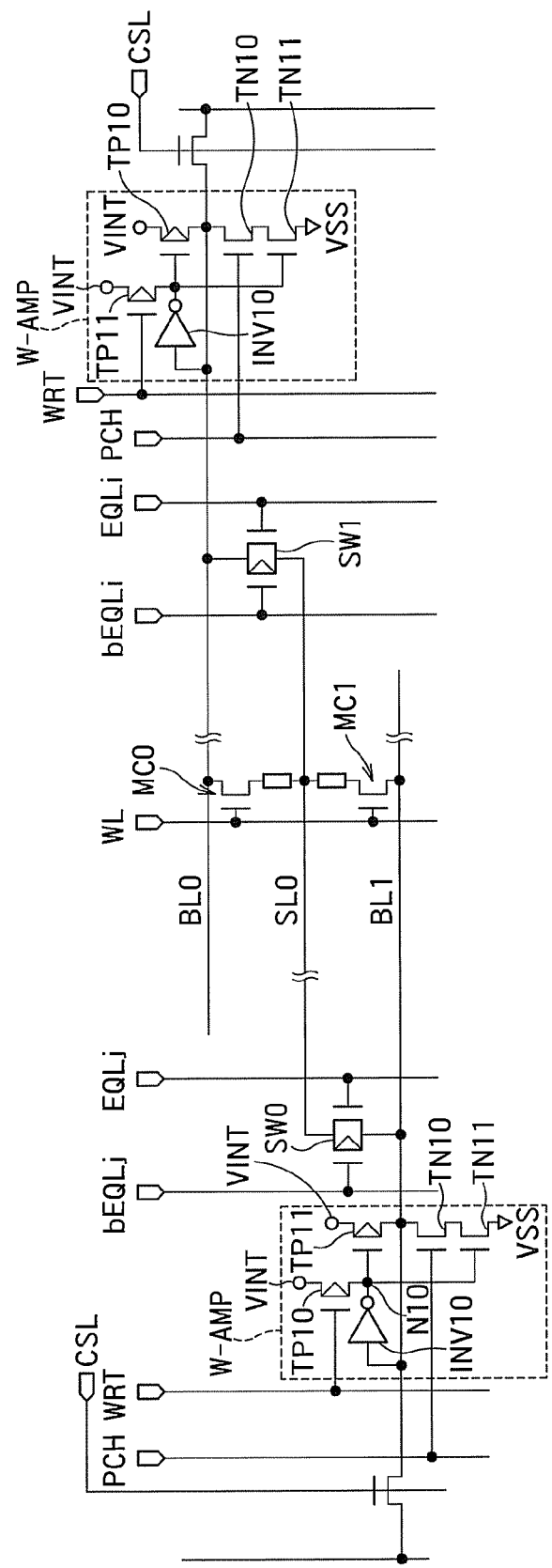
FIG. 9 is an explanatory diagram showing a configuration of the write amplifier W-AMP according to the third embodiment.

FIG. 9 is an explanatory diagram showing a configuration of the write amplifier W-AMP according to the third embodiment. FIG. 9 shows only a total of two write amplifiers W-AMP located on the both sides of the memory cell array, respectively. Other write amplifiers W-AMP have the same configuration. Only the write amplifier W-AMP connected to the bit line BL1 is explained here and explanations of the other write amplifiers W-AMP will be omitted.

The write amplifier W-AMP includes N-type transistors TN10 and TN11, P-type transistors TP10 and TP11, and an inverter INV10. The transistors TN10 and TN11 are serially connected between the corresponding bit line BL1 and the low-level voltage supply VSS. The transistor TN10 on the side of the bit line BL1 has a gate connected to a precharge signal line PCH. The transistor TN11 connected on the side of the voltage supply VSS has a gate connected to a node N10.

The transistor TP10 is connected between the voltage supply VINT and the node N10. The transistor TP10 has a gate connected to a write signal line WRT. The transistor TP11 is connected between the high-level voltage supply VINT and the bit line BL1. The transistor TP11 has a gate connected to the node N10.

The inverter INV10 has an input connected to the bit line BL1 and an output connected to the node N10. The inverter INV10 applies an inversion signal of logical data of the bit line BL1 to the transistors TN11 and TP11 to control the transistors TN11 and TP11.

The write amplifier W-AMP can latch data at the time of writing from the sense amplifier S/A to the bit line BL1 and then write the data to the memory cells MC during a precharge period.

In a write operation from the sense amplifier S/A to the bit line BL1, the precharge signal PCH and the write signal WRT are both logic high. At that time, in the write amplifier W-AMP, the transistor TN10 is turned on and the transistor TP10 is turned off. Accordingly, the inverter INV10 and the transistors TN11 and TP11 latch the write data written from the sense amplifier S/A to the bit line BL1. When the write data is logic high (data "1"), the node N10 has a logic low voltage, which turns the transistor TP11 on and the transistor TN11 off. In this way, the high-level voltage (VINT) is applied to the bit line BL1. This state is held by the inverter INV10.

On the other hand, when the write data is logic low (data "0"), the node N10 has a logic high voltage, which turns the transistor TN11 on and the transistor TP11 off. Therefore, the low-level voltage (VSS) is applied to the bit line BL1. This state is held by the inverter INV10. As described above, in the write operation, the write amplifier W-AMP can hold the write data transmitted from the sense amplifier S/A to the bit line BL1.

The write operation is similarly performed also in the write amplifier W-AMP connected to the bit line BL0 at the same time. Of course, the write amplifier W-AMP connected to the bit line BL0 can hold logical data different from that held in the write amplifier W-AMP connected to the bit line BL1.

The precharge signal PCH and the write signal WRT are logic high also during the precharge period. Therefore, the write amplifier W-AMP can keep applying the write data to the bit line BL1 also in the precharge period. This enables the write amplifier W-AMP to write data to the memory cell MC by selectively driving a word line WL even after end of the write operation (even after end of driving of the column select line CSL).

Because the bit line pair BLi and BLi+1 shares the source line SL, data writing needs to be performed for the bit lines BLi and BLi+1 of the bit line pair in different timings when the write amplifier W-AMP writes data to the memory cells MC. For example, when data is to be written to the bit line BL0, equalizing lines EQLi and EQLj are made logic low and logic high, respectively. Accordingly, the short-circuit switch SW1 disconnects the bit line BL0 from the source line SL0 and the short-circuit switch SW0 short-circuits the bit line BL1 to the source line SL0. This causes the source line SL0 to have a voltage equal to the bit line BL1. Therefore, the write amplifier W-AMP connected to the bit line BL0 can write the data to the memory cell MC0. On the other hand, when data is to be written to the bit line BL1, the equalizing lines EQLi and EQLj are made logic high and logic low, respectively. Accordingly, the short-circuit switch SW0 disconnects the bit line BL0 from the source line SL0 and the short-circuit switch SW1 short-circuits the bit line BL1 to the source line SL0. This causes the source line SL0 to have a voltage equal to the bit line BL0. Therefore, the write amplifier W-AMP connected to the bit line BL1 can write the data to the memory cell MC1.

In a read operation, the memory brings the precharge signal line PCH and the write signal line WRT logic low, thereby inactivating the write amplifier W-AMP.

Figure 10:
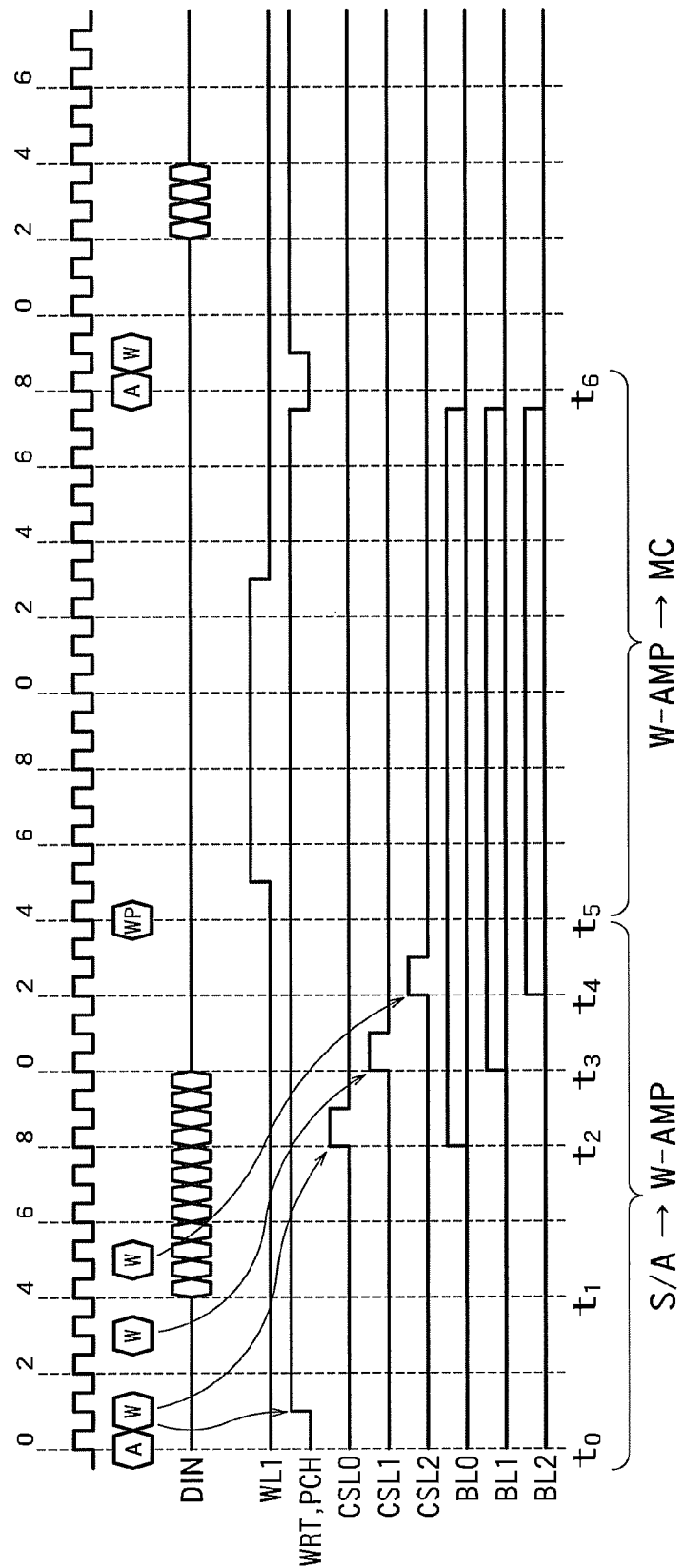
FIG. 10 is a timing chart showing a data write operation of the MRAM according to the third embodiment.

FIG. 10 is a timing chart showing a data write operation of the MRAM according to the third embodiment. When the memory receives an active signal A and a signal W at a time t0, the write signal WRT and the precharge signal PCH are raised logic high. This enables the write amplifier W-AMP to latch data of the corresponding bit line BL. The signal W successively drives the column select lines CSL.

At a time t1, the memory starts receiving the data DIN. When the column select signal CSL0 is driven at a time t2, the multiplexer MUX on the right side in FIG. 8 selects the bit line BL0 and connects the bit line BL0 to a sense bit line SBL2. In this way, the write amplifier W-AMP connected to the bit line BL0 stores therein the write data. When the column select line CSL1 is driven at a time t3, the multiplexer MUX on the left side in FIG. 8 selects the bit line BL1 and connects the bit line BL1 to a sense bit line SBL1. In this way, the write amplifier W-AMP connected to the bit line BL1 stores therein the write data. Similarly, when the column select line CSL2 is driven at a time t4, the write amplifier W-AMP connected to the bit line BL2 stores therein the write data. Although not shown in FIG. 10, the data can be similarly written also to the write amplifier W-AMP connected to the bit line BL3.

When a write precharge signal WP is received at a time t5, a column select period ends and the memory is brought into a precharge state for a sense node of the sense amplifier S/A. The memory then selectively drives one of the word lines WL0 to WL3 during the precharge period. This enables the write amplifier W-AMP to write data to the memory cell MC.

In the third embodiment, the write amplifiers W-AMP are provided corresponding to the bit lines BL, respectively. Accordingly, the write amplifiers W-AMP can hold data to the memory cells MC in all the columns (the first writing step). Writing from the write amplifiers W-AMP to the memory cells MC (the second writing step) then needs to be repeated twice. For example, the write amplifiers W-AMP in all the columns store therein the write data applied to the corresponding bit lines BL in the first writing step. Next, in the second writing step, the MRAM performs the second writing step in a state where the short-circuit switches SW1 are brought into conduction and the short-circuit switches SW0 are brought into non-conduction, thereby writing the data to the memory cells MC connected to the bit lines BL0 and BL2. The MRAM then performs the second writing step in a state where the short-circuit switches SW0 are brought into conduction and the short-circuit switches SW1 are brought into non-conduction, thereby writing the data to the memory cells MC connected to the bit lines BL1 and BL3. In this way, the third embodiment can increase the write speed more than in the second embodiment.

The write amplifiers W-AMP (FIG. 9) according to the third embodiment have a smaller circuit scale than that of the write amplifiers W-AMP (FIGS. 6A and 6B) according to the first or second embodiment. The write amplifiers W-AMP are provided in a number corresponding to the bit lines or bit line pairs. Therefore, reduction in the circuit scale of the write amplifiers W-AMP leads to reduction in the entire size of the memory.

(First Modification of Third Embodiment)

Figure 11:
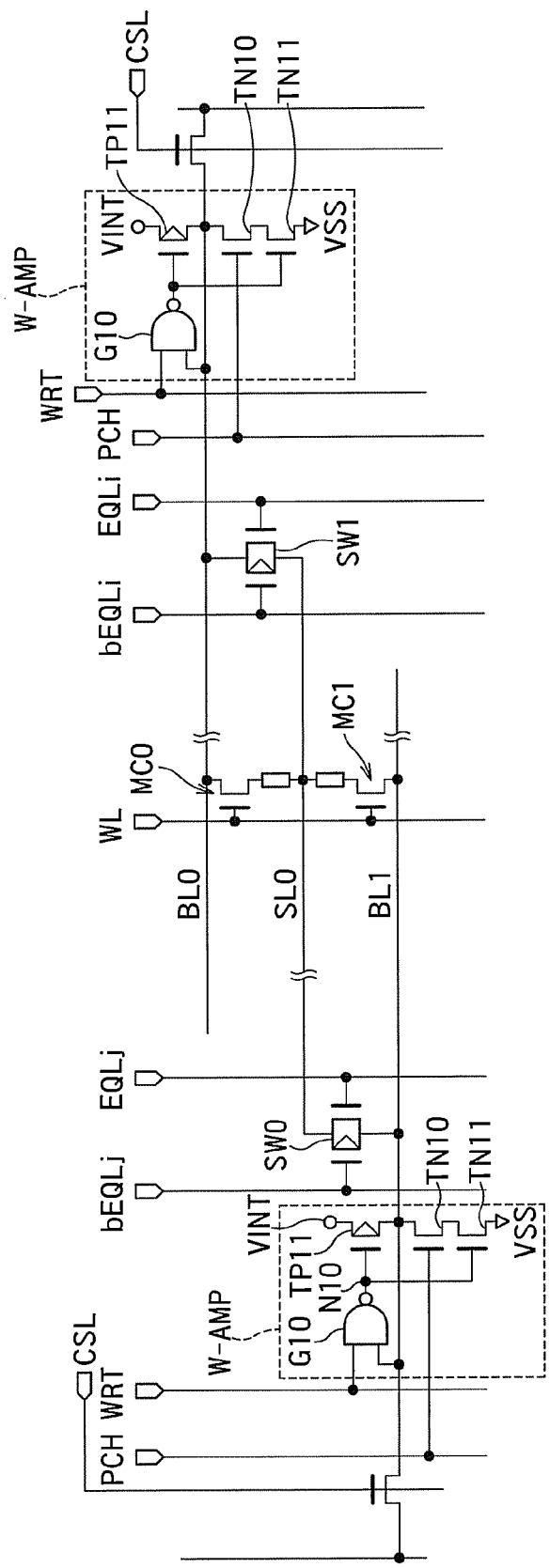
FIG. 11 is an explanatory diagram showing configurations of write amplifiers W-AMP according to a first modification of the third embodiment.

FIG. 11 is an explanatory diagram showing configurations of write amplifiers W-AMP according to a first modification of the third embodiment. The write amplifiers W-AMP according to the first modification include an NAND gate G10 instead of the transistor TP10 and the inverter INV10 shown in FIG. 9. Other configurations of the first modification can be identical to those of the third embodiment. A configuration of the write amplifier W-AMP connected to the bit line BL1 is explained below and explanations of the write amplifier W-AMP connected to the bit line BL0 will be omitted.

The NAND gate G10 has two inputs connected to the bit line BL1 and the write signal line WRT, and an output connected to the node N10. In this way, when the precharge signal line PCH and the write signal line WRT become logic high, the NAND gate G10 controls the transistors TN11 and TP11 to hold a logical value of the bit line BL1.

In a read operation, the memory brings the precharge signal line PCH and the write signal line WRT to be logic low, thereby inactivating the write amplifiers W-AMP.

Other operations of the MRAM according to the first modification can be identical to those of the MRAM according to the third embodiment. Therefore, the first modification can achieve effects identical to those of the second embodiment.

Further, in the first modification, the NAND gate G10 is used instead of the inverter INV10. The inverter INV10 has a possibility of driving the transistor TP11 when the bit line BL1 has a high-level voltage (exceeds a logical threshold) at the time of reading. In contrast, in the first modification, even when the bit line BL1 has a high-level voltage at the time of reading, the NAND gate G10 keeps the transistor TP11 in an off state. Therefore, the write amplifiers W-AMP can be reliably inactivated at the time of data reading in the first modification.

(Second Modification of Third Embodiment)

Figure 12:
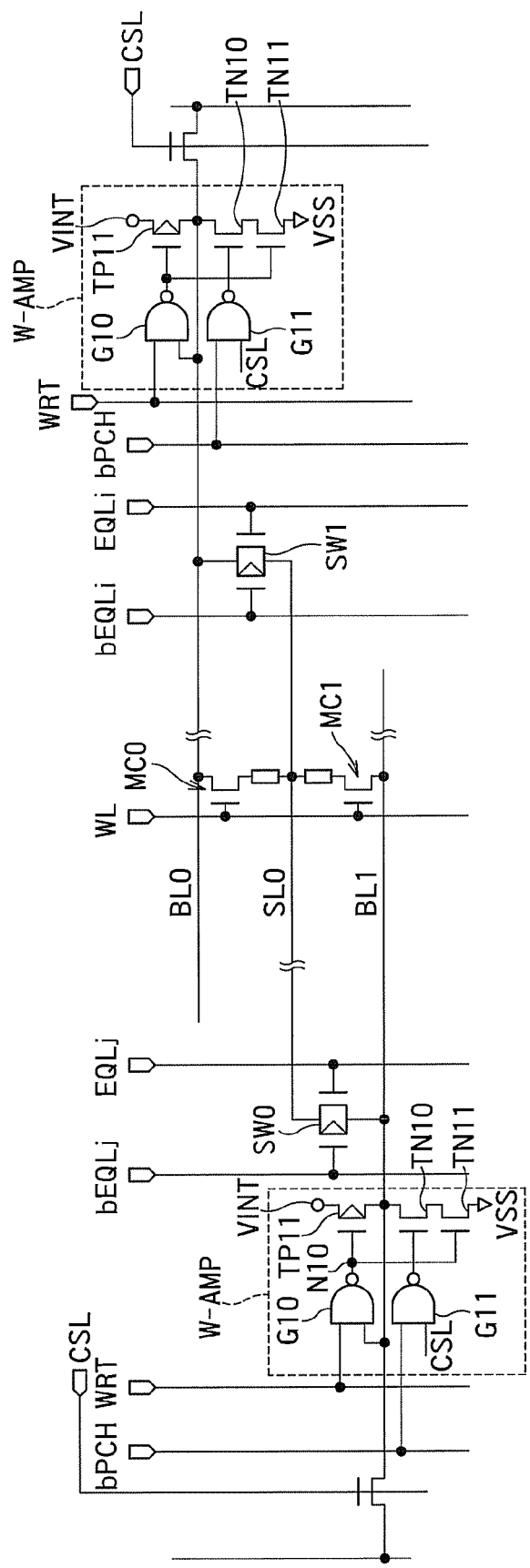
FIG. 12 is an explanatory diagram showing configurations of write amplifiers W-AMP according to a second modification of the third embodiment.

FIG. 12 is an explanatory diagram showing configurations of write amplifiers W-AMP according to a second modification of the third embodiment. The write amplifiers W-AMP according to the second modification include the first NAND gate G10 and also a second NAND gate G11 connected between an inversion signal bPCH of the precharge signal and the transistor TN10. Other configurations of the second modification can be identical to those of the first modification. A configuration of the write amplifier W-AMP connected to the bit line BL1 is explained below and explanations of the write amplifier W-AMP connected to the bit line BL0 will be omitted.

The NAND gate G11 has two inputs connected to the inversion signal bPCH of the precharge signal line and the column select signal CSL. The NAND gate G11 has an output connected to the gate of the transistor N10.

At the time of writing, the write signal line WRT becomes logic high and the inversion signal bPCH of the precharge signal line becomes logic low. Accordingly, the NAND gate G10 controls the transistors TN11 and TP11 to hold a logical value of the bit line BL1. At that time, the NAND gate G11 keeps the transistor TN10 in an on state regardless of a signal of the column select line CSL. Therefore, a write operation in the second modification is identical to that in the first embodiment.

In a read operation, the write signal line WRT becomes logic low and the inversion signal bPCH of the precharge signal line becomes logic high. Accordingly, the NAND gate G10 brings the transistor TP10 into an off state and the transistor TN11 into an on state. The NAND gate G11 brings the transistor TN10 into an off state when the column select line CSL corresponding to the bit line BL1 becomes logic high (is selected). The NAND gate G11 brings the transistor TN10 into an on state when the column select line CSL corresponding to the bit line BL1 is logic low (is not selected). That is, the write amplifiers W-AMP according to the second modification can bring the transistors TN10 and TN11 into the on states and precharge the bit line BL1 to the low-level voltage (VSS) when the column of the bit line BL1 is not selected. Of course, because the bit line BL1 transmits read data when the column of the bit line BL1 is selected, the write amplifiers W-AMP bring the transistor TN10 into the off state to disconnect the bit line BL1 from the low-level voltage supply VSS.

At the time of reading, the transistor TN11 is in the off state while the transistors TP11 and TN10 maintain the off states in the first modification. Therefore, the non-selected bit lines BL become electrically floating in the read operation.

In contrast, the write amplifiers W-AMP according to the second modification can fix (precharge) the non-selected bit lines BL to the low-level voltage (VSS) at the time of reading.

Other operations of the MRAM according to the second modification can be identical to those of the MRAM according to the first modification. Therefore, the second modification can achieve effects identical to those of the first modification.

(Fourth Embodiment)

Figure 13:
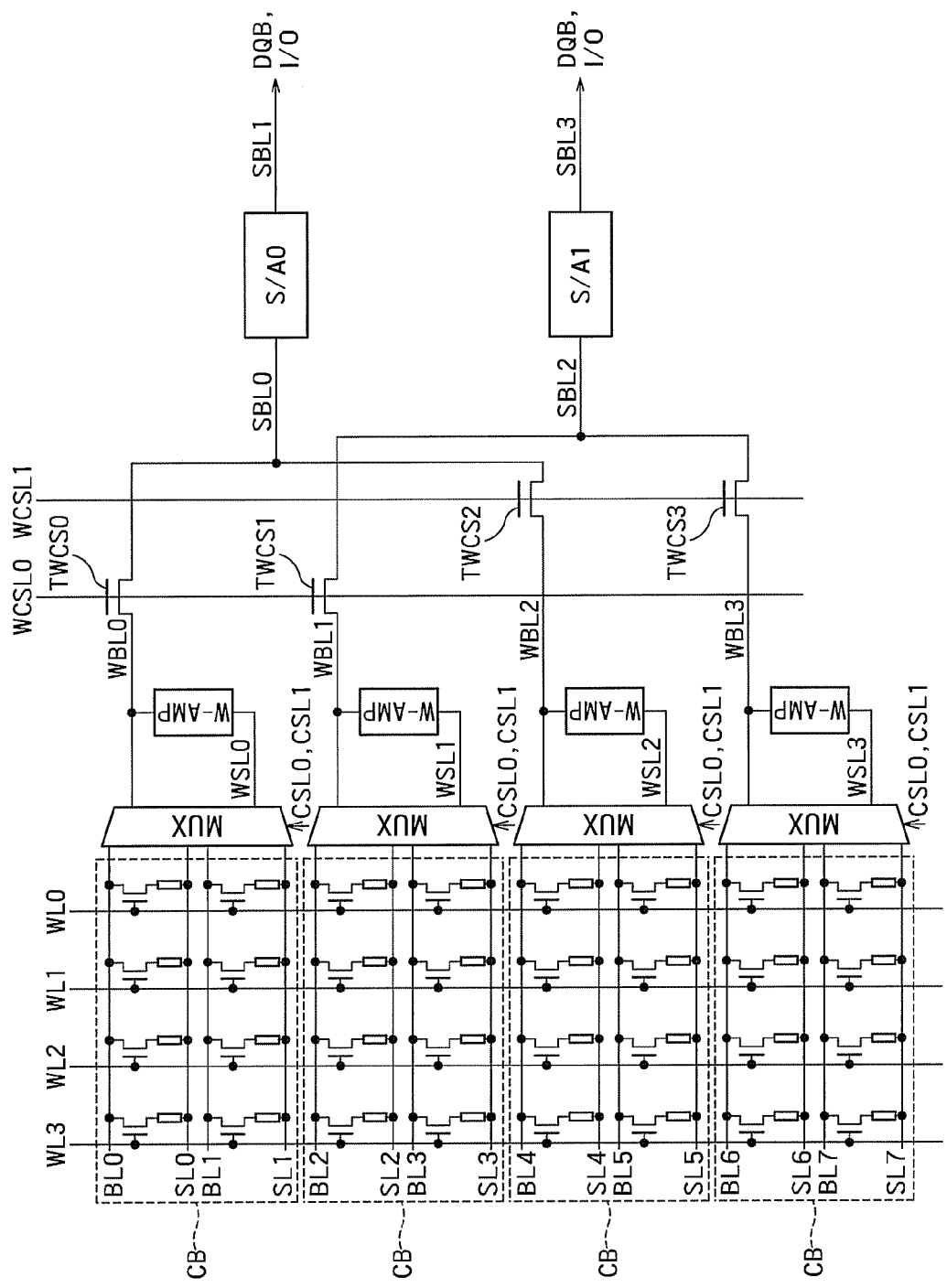
FIG. 13 is a block diagram of a memory cell array and peripheral circuits of an MRAM according to a fourth embodiment.

FIG. 13 is a block diagram of a memory cell array and peripheral circuits of an MRAM according to a fourth embodiment of the present invention. In the fourth embodiment, the write amplifiers W-AMP are provided between the multiplexers MUX and the sense amplifiers S/A0 and S/A1. The write amplifiers W-AMP are each shared by plural bit lines BL.

A memory cell block CB includes memory cells MC each being connected to the bit lines BLi and BLi+1 in two columns. The source lines SL are provided corresponding to the bit lines BL, respectively. The multiplexers MUX and the write amplifiers W-AMP are provided corresponding to the memory cell blocks CB, respectively. The sense amplifiers S/A0 and S/A1 are provided corresponding to plural multiplexers MUX and plural write amplifiers W-AMP. Therefore, write-column select transistors TWCS0 to TWCS3 and write-column select lines WCSL0 and WCSL1 are provided to select the multiplexer MUX and the write amplifier W-AMP to be connected to the sense amplifier S/A0 or S/A1 at the time of data writing.

The write amplifiers W-AMP are connected between a write bit line WBLi and a write source line WSLi. The multiplexers MUX select one of the bit lines BL and the corresponding source line to connect the selected bit line and the selected source line to the write bit line WBLi and the write source line WSLi, respectively. This enables the write amplifiers W-AMP to be connected to the selected bit line BL and the selected source line SL at the time of data writing. In this way, the write amplifiers W-AMP can write data to the memory cells MC in a selected column in the corresponding memory cell block CB.

The write-column select transistors TWCS0 and TWCS1 controlled by the same write-column select line WCSL0 are connected to the different sense amplifiers S/A0 and S/A1, respectively. The write-column select transistors TWCS2 and TWCS3 controlled by the same write-column select line WCSL1 are also connected to the different sense amplifiers S/A, respectively. The write-column select lines WCSL0 and WCSL1 transmit complementary data. This prevents the sense amplifiers S/A to be simultaneously connected to plural write bit lines WBL and plural write amplifiers W-AMP. For example, when the write-column select line WCSL0 is driven logic high, the sense amplifier S/A0 is connected to the write bit line WBL0 and the sense amplifier S/A1 is connected to the write bit line WBL1. When the write-column select line WCSL1 is driven logic high, the sense amplifier S/A0 is connected to the write bit line WBL2 and the sense amplifier S/A1 is connected to the write bit line WBL3. In this way, the sense amplifiers S/A0 and S/A1 can write different data to the write amplifiers W-AMP connected to the corresponding write bit lines WBL0 to WBL3.

A specific configuration of the write amplifiers W-AMP can be identical to that of the write amplifiers W-AMP according to the first embodiment.

Figure 14:
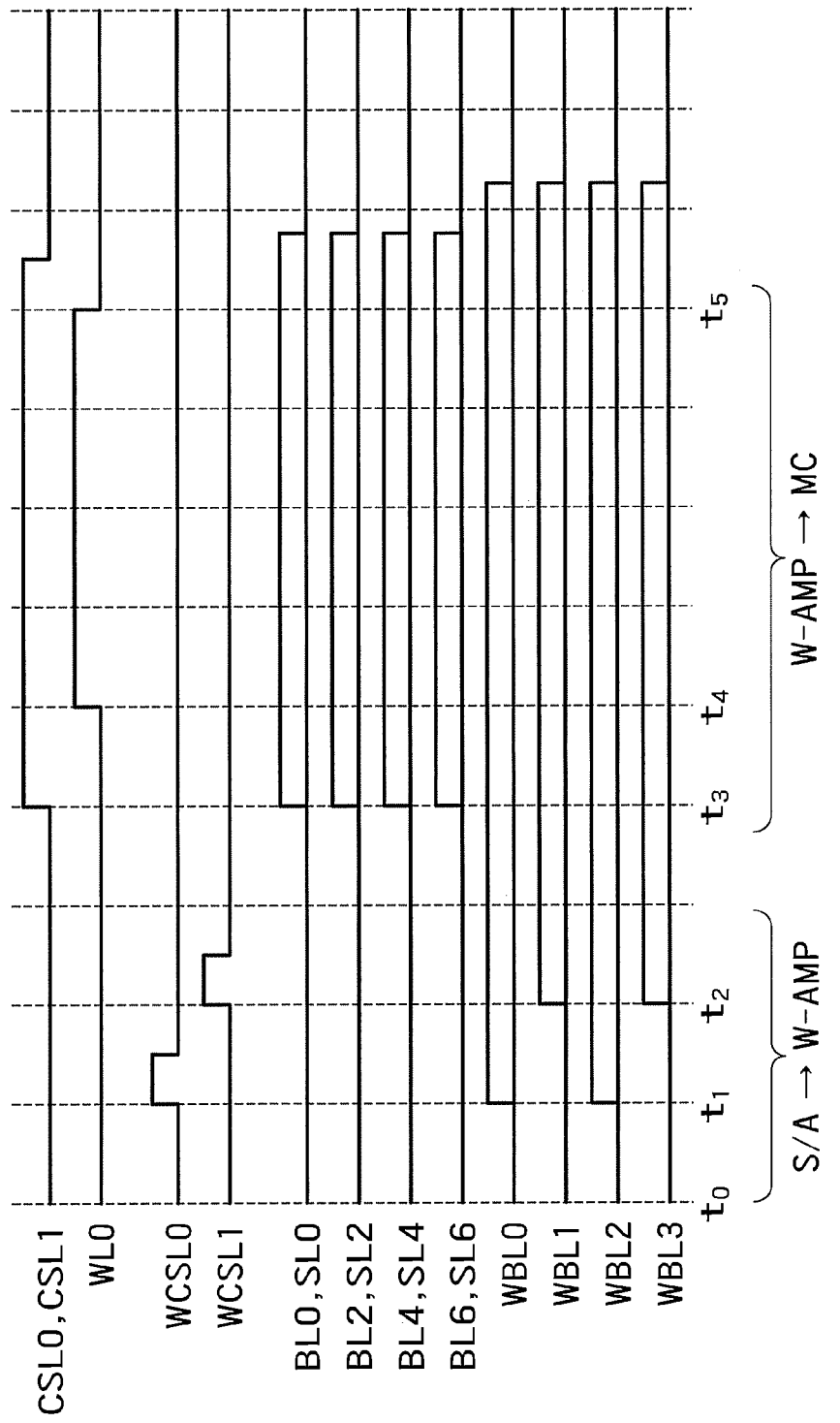
FIG. 14 is a timing chart showing a data write operation of the MRAM according to the fourth embodiment.

FIG. 14 is a timing chart showing a data write operation of the MRAM according to the fourth embodiment. Here, the word line WL0 is selected and data are written to the memory cells MC connected to the word line WL0.

At a time t1, the write-column select line WCSL0 is selected. At that time, the sense amplifiers S/A0 and S/A1 are connected to the write bit lines WBL0 and WBL1, respectively. The write amplifiers W-AMP corresponding to the write bit lines WBL0 and WBL1 hold the write data.

At a time t2, the write-column select line WCSL1 is selected. At that time, the sense amplifiers S/A0 and S/A1 are connected to the write bit lines WBL2 and WBL3, respectively. The write amplifiers W-AMP corresponding to the write bit lines WBL2 and WBL3 hold the write data. This ends writing from the sense amplifiers S/A0 and S/A1 to the write amplifiers W-AMP (the first writing step).

At a time t3, either the column select line CSL0 or CSL1 is selectively driven. This connects the write bit line WBLi and the write source line WSLi to any of the bit lines BL and any of the source lines SL included in the memory cell block CB, respectively. For example, when the column select line CSL0 is selected, the multiplexer MUX connected to the write bit line WBL0 connects the write bit line WBL0 and the write source line WSL0 to the bit line BL0 and the source line SL0, respectively. Similarly, the multiplexer MUX connected to the write bit line WBL1 connects the write bit line WBL1 and the write source line WSL1 to the bit line BL2 and the source line SL2, respectively. The multiplexer MUX connected to the write bit line WBL2 connects the write bit line WBL2 and the write source line WSL2 to the bit line BL4 and the source line SL4, respectively. The multiplexer MUX connected to the write bit line WBL3 connects the write bit line WBL3 and the write source line WSL3 to the bit line BL6 and the source line SL6, respectively. In this way, voltages of the selected bit lines BL0, BL2, BL4, and BL6 and the selected source lines SL0, SL2, SL4, and SL6 are determined.

At a time t4, the word line WL0 is selectively driven. This enables the write amplifiers W-AMP to write data to the memory cells MC connected to the selected word line WL0 and the bit lines BL0, Bl2, BL4, and BL6, respectively (the second writing step). The write amplifiers W-AMP keep applying the write voltage to the corresponding memory cells MC until the word line WL0 falls at a time t5.

To write data to the memory cells MC connected to the bit lines BL1, BL3, BL5, and BL7, it suffices that the first writing step is performed again and then the second writing step is performed with the column select line CSL1 being selected.

In the fourth embodiment, the number of sense amplifiers S/A can be changed by changing the circuit configuration between the sense amplifiers S/A and the write amplifiers W-AMP. That is, a ratio between the number of sense amplifiers and the number of write amplifiers can be controlled. In this way, an operation speed of the first writing step can be adjusted.

In the fourth embodiment, the write amplifiers W-AMP are located between the multiplexers MUX and the sense amplifiers S/A. Accordingly, wiring capacities from the sense amplifiers S/A to the writing amplifiers W-AMP are relatively small and the speed of the first writing step is high. On the other hand, writing capacities from the writing amplifiers W-AMP to the memory cells MC are larger and therefore the speed of the second writing step is assumed to be lower. However, even if the speed is lower, this causes little problem because the second writing step is performed in the precharge period of sense nodes of the sense amplifiers S/A.

(Fifth Embodiment)

Figure 15:
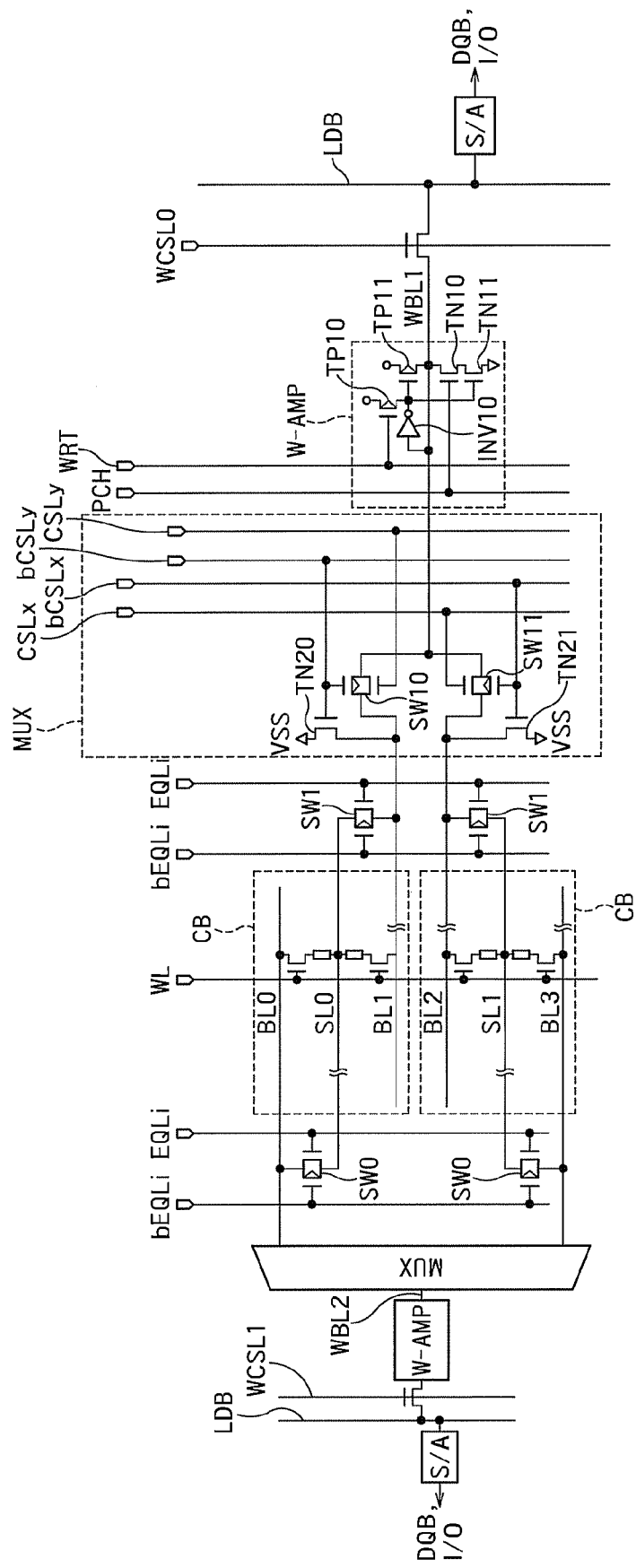
FIG. 15 is a block diagram of a memory cell array and peripheral circuits of an MRAM according to a fifth embodiment.

FIG. 15 is a block diagram of a memory cell array and peripheral circuits of an MRAM according to a fifth embodiment of the present invention. In the fifth embodiment, the write amplifiers W-AMP are provided corresponding to plural memory cell blocks CB and plural bit lines BL0 to BL3. Each of the write amplifiers W-AMP is connected between the multiplexer MUX and the sense amplifier S/A. While one write amplifier W-AMP is shown with respect to one sense amplifier S/A in FIG. 15, the sense amplifier S/A is provided corresponding to plural write amplifiers W-AMP like in the fourth embodiment.

The write amplifiers W-AMP can have the same configuration as that of the write amplifiers W-AMP in the third embodiment (FIG. 9). The write amplifiers W-AMP can have the same configuration as that of the write amplifiers W-AMP shown in FIG. 11 or 12. The memory cell blocks CB and the short-circuit switches SW0 and SW1 also can have the same configurations as those in the third embodiment. Here, only configurations of the multiplexer MUX and the write amplifier W-AMP on the right of the memory cell array are shown in FIG. 15. The multiplexer MUX and the write amplifier W-AMP on the left of the memory cell array have the same configurations as those on the right, and therefore explanations thereof will be omitted. While FIG. 15 shows one write amplifier W-AMP and one multiplexer MUX provided on each of the right and left of the memory cell array, plural write amplifiers W-AMP and plural multiplexers MUX can be provided according to the number of memory cell blocks CB.

The write amplifier W-AMP stores the held write data in the write bit line WBL. The multiplexer MUX is connected to the write amplifier W-AMP via the write bit line WBL1. The multiplexer MUX includes a switching element SW10 connected between the write bit line WBL1 and the bit line BL1 of the memory cell block CB, and a switching element SW11 connected between the write bit line WBL1 and the bit line BL2 of the memory cell block CB. The switching element SW10 is controlled by complementary column select signals CSLy and bCSLy. The switching element SW11 is controlled by complementary column select signals CSLx and bCSLx. The multiplexer MUX further includes an NMOS transistor TN20 connected between the low-level voltage supply VSS and the bit line BL1 of the memory cell block CB, and an NMOS transistor TN21 connected between the low-level voltage supply VSS and the bit line BL2 of the memory cell block CB. The transistors TN20 and TN21 are controlled by the column select signals bCSLy and bCSLx, respectively.

Similarly, the multiplexer MUX shown on the left side in FIG. 15 is connected between the write bit line WBL2 and the bit line BL0 of the memory cell block CB and between the write bit line WBL2 and the bit line BL3 of the memory cell block CB.

In this way, the multiplexer MUX connects the write bit line WBL1 to the bit line BL1 and transfers the write data to the memory cells MC connected to the bit line BL1 when the column select line CSLy is driven logic high. At that time, the transistor TN20 disconnects between the voltage supply VSS and the bit line BL1. The short-circuit switches SW0 short-circuit the bit lines BL0 and BL3 to the source lines SL0 and SL1, respectively.

The multiplexer MUX connects the write bit line WBL1 to the bit line BL2 and transfers the write data to the memory cells MC connected to the bit line BL2 when the column select line CSLx is driven logic high. At that time, the transistor TN21 disconnects between the voltage supply VSS and the bit line BL2. The short-circuit switches SW0 short-circuit the bit lines BL0 and BL3 to the source lines SL0 and SL1, respectively.

In this way, the multiplexer MUX can write data of the write amplifier W-AMP to either the bit line BL1 or BL2. Here, when the column select lines CSLx and CSLy are not selected, the switching elements SW10 and SW11 disconnect the write bit lines WBL1 and the bit lines BL1 and BL2, and the transistors TN20 and TN21 maintain the bit lines BL1 and BL2 at the low-level voltage (VSS).

The multiplexer MUX shown on the left side in FIG. 15 similarly operates, thereby enabling transfer of data of the write amplifier W-AMP to either the bit line BL0 or BL3. At that time, the short-circuit switches SW1 short-circuit the bit lines BL1 and BL2 to the source lines SL0 and SL1, respectively.

FIG. 16 is a timing chart showing a data write operation of the MRAM according to the fifth embodiment. When the memory receives an active signal A and a signal W at a time t0, the memory raises the write signal WRT and the precharge signal PCH logic high. This enables the write amplifiers W-AMP to latch data of the corresponding bit lines BL. The signal W successively drives the write-column select lines WCSL.

At a time t1, the memory starts receiving the data DIN. When the write-column select line WCSL0 is driven at a time t2, the sense amplifier S/A shown on the right side in FIG. 15 writes the write data to the corresponding write amplifier W-AMP. In FIG. 15, only one write-column select line WCSL is shown on the right of the memory cell array. However, the write-column select lines WCSL are practically provided in a number equal to the number of write amplifiers W-AMP corresponding to one sense amplifier S/A. By successively driving the write-column select lines WCSL, the sense amplifier S/A can transfer the write data to all the corresponding write amplifiers W-AMP. The write amplifiers W-AMP store the write data in the write bit line WBL1.

When the write-column select line WCSL1 is driven at a time t3, the sense amplifier S/A on the left side in FIG. 15 writes the write data to the corresponding write amplifier W-AMP. Only one write-column select line WCSL is shown on the left of the memory cell array in FIG. 15. However, the write-column select lines WCSL are practically provided in a number equal to the number of write amplifiers W-AMP corresponding to one sense amplifier S/A. By successively driving the write-column select lines WCSL, the sense amplifier S/A can transfer the write data to all the corresponding write amplifiers W-AMP. The write amplifiers W-AMP store the write data in the write bit line WBL2 (the first writing step).

When a write precharge signal WP is received at a time t5, the multiplexer MUX drives either the column select line CSLx or CSLy and connects the write bit line WBL1 to either the bit line BL1 or BL2.

By raising a selected word line WL at a time t6, the write amplifiers W-AMP write the write data to the memory cells MC. At that time, each of the write amplifiers W-AMP on one side of the memory cell array first writes the data to the memory cell MC connected to the bit line (BL1, BL5, BL9 . . . , for example) in one column of the corresponding memory cell blocks CB. Each of the write amplifiers W-AMP on the other side of the memory cell array then writes the data to the memory cell MC connected to the bit line (BL0, BL4, BL8 . . . , for example) in one column of the corresponding memory cell blocks CB (the second writing step).

By repeating the first and second writing steps again, the data can be written to the memory cells MC connected to the remaining bit lines (BL2, BL6, BL10 . . . , and BL3, BL7, BL11 . . . , for example). That is, the sense amplifiers S/A, the write amplifiers W-AMP, and the multiplexers MUX on the right and left of the memory cell array alternately perform the first and second writing steps twice, whereby the memory can write the data to the bit lines BL in all the columns.

In the MRAM according to the fifth embodiment, the write amplifiers W-AMP are provided corresponding to the plural memory cell blocks CB and the plural bit lines BL0 to BL3. The number of write amplifiers W-AMP can be changed by changing the circuit configuration of the multiplexers MUX. That is, a ratio between the number of write amplifiers and the number of bit lines can be controlled. In this way, the operation speed of the second writing step can be adjusted.

In the fifth embodiment, the number of sense amplifiers S/A can be changed by changing the circuit configuration between the sense amplifier S/A and the write amplifier W-AMP. Therefore, the operation speed of the first writing step can be adjusted like in the fourth embodiment.

The write amplifiers W-AMP are each provided between the multiplexer MUX and the sense amplifier S/A in the fifth embodiment. Accordingly, the speed of the first writing step is high in the fifth embodiment like in the fourth embodiment.

In the above embodiments, the number of write amplifiers W-AMP is larger than the number of sense amplifiers S/A. That is, plural write amplifiers W-AMP are provided for one sense amplifier S/A. Therefore, the MRAMs according to the above embodiments can reduce the number of sense amplifiers S/A having large sizes and reduce chip sizes of the MRAMs while speeding-up the write operation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a plurality of bit lines;
   a plurality of word lines;

at least one source line;

magnetic tunnel junction elements and transistors, each magnetic tunnel junction element and each transistor being serially connected between the respective bit lines and the source line;

a sense amplifier configured to detect data stored in the magnetic tunnel junction elements;

a multiplexer between the plural bit lines and the sense amplifier in order to select one of the bit lines to be connected to the sense amplifier; and a plurality of write amplifiers corresponding to a plurality of memory cell blocks each including a plurality of memory cells each including one of the magnetic tunnel junction elements and one of the transistors, and connected to the bit lines or connected to the bit lines via the multiplexer, wherein at data writing, the write amplifiers hold the write voltage after the sense amplifier applies a write voltage to the bit lines.

2. The device of claim 1, wherein in a data write operation, the sense amplifier performs a first writing step to write data to the write amplifiers, and the write amplifiers perform a second writing step to write the data to the memory cells in the memory cell block corresponding to the write amplifiers.

3. The device of claim 2, wherein in the second writing step, driving of the word lines is performed after end of a data write period and during a precharge period of the sense amplifier.

4. The device of claim 1 wherein
the multiplexer successively selects the bit lines and successively transmits write data from the sense amplifier to the bit lines at a time of data writing,
the write amplifiers respectively correspond to the bit lines, the write amplifiers are respectively connected between the bit lines and the source line, and the write amplifiers hold the write data transmitted to the bit lines at the time of data writing, and
by driving one of the word lines after writing to the write amplifiers ends, the write amplifiers write the write data to the memory cell connected to the driven word line.

5. The device of claim 2 wherein
the multiplexer successively selects the bit lines and successively transmits write data from the sense amplifier to the bit lines at a time of data writing,
the write amplifiers respectively correspond to the bit lines, the write amplifiers are respectively connected between the bit lines and the source line, and the write amplifiers hold the write data transmitted to the bit lines at the time of data writing, and
by driving one of the word lines after writing to the write amplifiers ends, the write amplifiers write the write data to the memory cell connected to the driven word line.

6. The device of claim 3 wherein
the multiplexer successively selects the bit lines and successively transmits write data from the sense amplifier to the bit lines at a time of data writing,
the write amplifiers respectively correspond to the bit lines, the write amplifiers are respectively connected between the bit lines and the source line, and the write amplifiers hold the write data transmitted to the bit lines at the time of data writing, and
by driving one of the word lines after writing to the write amplifiers ends, the write amplifiers write the write data to the memory cell connected to the driven word line.

7. The device of claim 1, wherein
each pair of adjacent bit lines shares a source line,
the device further comprises short-circuit switches each connected between the bit line and the corresponding source line,
the write amplifiers respectively correspond to the pairs of the bit lines and hold write data transmitted to any one of bit lines of the corresponding bit line pair at a time of data writing,
by driving one of the word lines after writing to the write amplifiers ends, the write amplifiers write the write data to the memory cell connected to the driven word line.

8. The device of claim 2, wherein
each pair of adjacent bit lines shares a source line,
the device further comprises short-circuit switches each connected between the bit line and the corresponding source line,
the write amplifiers respectively correspond to the pairs of the bit lines and hold write data transmitted to any one of bit lines of the corresponding bit line pair at a time of data writing,
by driving one of the word lines after writing to the write amplifiers ends, the write amplifiers write the write data to the memory cell connected to the driven word line.

9. The device of claim 3, wherein
each pair of adjacent bit lines shares a source line,
the device further comprises short-circuit switches each connected between the bit line and the corresponding source line,
the write amplifiers respectively correspond to the pairs of the bit lines and hold write data transmitted to any one of bit lines of the corresponding bit line pair at a time of data writing,
by driving one of the word lines after writing to the write amplifiers ends, the write amplifiers write the write data to the memory cell connected to the driven word line.

10. The device of claim 7, wherein the write amplifiers are connected between the pair of the bit lines.

11. The device of claim 1, wherein
each pair of adjacent bit lines shares a source line,
the device further comprises short-circuit switches each connected between the bit line and the corresponding source line,
the write amplifiers respectively correspond to the bit lines and hold write data transmitted to corresponding one of the bit lines at a time of data writing, and
by driving one of the word lines after writing of the write amplifiers ends, the write amplifiers write the write data to the memory cells connected to the driven word line.

12. The device of claim 2, wherein
each pair of adjacent bit lines shares a source line,
the device further comprises short-circuit switches each connected between the bit line and the corresponding source line,
the write amplifiers respectively correspond to the bit lines and hold write data transmitted to corresponding one of the bit lines at a time of data writing, and
by driving one of the word lines after writing of the write amplifiers ends, the write amplifiers write the write data to the memory cells connected to the driven word line.

13. The device of claim 3, wherein
each pair of adjacent bit lines shares a source line,
the device further comprises short-circuit switches each connected between the bit line and the corresponding source line,
the write amplifiers respectively correspond to the bit lines and hold write data transmitted to corresponding one of the bit lines at a time of data writing, and by driving one of the word lines after writing of the write amplifiers ends, the write amplifiers write the write data to the memory cells connected to the driven word line.

14. The device of claim 11, wherein the write amplifiers are connected between the bit lines and the multiplexer.

15. The device of claim 11, wherein in a data read operation, the write amplifiers disconnect the corresponding bit lines and a voltage supply regardless of voltage levels of the bit lines.

16. The device of claim 11, wherein in a data read operation, the write amplifiers connect the corresponding bit lines to a voltage supply to fix voltages of the bit lines when the bit lines are not selected, and disconnect the corresponding bit lines from the voltage supply when the bit lines are selected.

17. The device of claim 1, wherein
the write amplifiers are provided between the multiplexer and the sense amplifier, and
at data writing, after the sense amplifier applies a write voltage to the bit lines, the write amplifiers write data to the memory cells via bit lines selected by the multiplexer.

18. The device of claim 17, wherein the write amplifiers correspond to a plurality of the bit lines.

19. The device of claim 1, wherein the number of the write amplifiers is larger than the number of the sense amplifiers.

* * * * *